(12) United States Patent
Ankarbjörk et al.

(10) Patent No.: US 10,743,437 B2
(45) Date of Patent: Aug. 11, 2020

(54) MOUNTING OF A TELECOMMUNICATION EQUIPMENT TO A STRUCTURE

(71) Applicant: Telefonaktiebolaget LM Ericsson (publ), Stockholm (SE)

(72) Inventors: Andreas Ankarbjörk, Sundbyberg (SE); Jonas Hallhagen, Solna (SE); Evalena Stokes, Sigtuna (SE); Mikael Pohlman, Göteborg (SE); Tom Andersson, Jönköping (SE); Jens Kallin, Uppsala (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 661 days.

(21) Appl. No.: 15/307,773

(22) PCT Filed: Mar. 9, 2015

(86) PCT No.: PCT/EP2015/054851
§ 371 (c)(1),
(2) Date: Oct. 28, 2016

(87) PCT Pub. No.: WO2015/165628
PCT Pub. Date: Nov. 5, 2015

(65) Prior Publication Data
US 2017/0055363 A1    Feb. 23, 2017

Related U.S. Application Data

(60) Provisional application No. 61/986,490, filed on Apr. 30, 2014.

(51) Int. Cl.
*H05K 7/18* (2006.01)
*H05K 5/02* (2006.01)
*F16M 13/02* (2006.01)

(52) U.S. Cl.
CPC .............. *H05K 7/186* (2013.01); *F16M 13/02* (2013.01); *H05K 5/0204* (2013.01); *H05K 7/183* (2013.01)

(58) Field of Classification Search
CPC ...... H05K 7/186; H05K 5/0204; H05K 7/183; F16M 13/02; Y10T 403/7182; Y10T 403/59; Y10T 403/591
(Continued)

(56) References Cited

U.S. PATENT DOCUMENTS 906,247 A * 12/1908 Mahoney ................ E03C 1/322
248/225.21
1,039,903 A * 10/1912 Crane ..................... E03C 1/322
248/222.13
(Continued)

FOREIGN PATENT DOCUMENTS

CN        103410260 A    11/2013
JP        H11118205 A    4/1999

OTHER PUBLICATIONS

International Preliminary Report on Patentability, Application No. PCT/EP2015/054851, dated Nov. 1, 2016, 6 pages.
(Continued)

*Primary Examiner* — Kimberly T Wood
(74) *Attorney, Agent, or Firm* — Patent Portfolio Builders, PLLC

(57) ABSTRACT

A flexible and inexpensive solution for mounting telecommunication equipment to a structure. For example, a mounting bracket for mounting telecommunication equipment to the structure is described. The mounting bracket comprises an upper end and an opposite lower end. A surface between the upper end and the opposite lower end is adapted to abut the telecommunication equipment. The upper end has an essentially semi-circular protrusion. This essentially semi-circular protrusion is adapted to pivotally engage with a
(Continued)

corresponding hook-like protrusion of a mounting rail in a locking manner. Moreover, the lower opposite end of the mounting bracket comprises a protrusion that is substantially perpendicular to said surface and that extends in a direction away from said surface. This protrusion includes at least one fastener which is adapted to engage with a corresponding end of the mounting rail such that the mounting rail can be locked to the mounting bracket.

21 Claims, 20 Drawing Sheets

(58) Field of Classification Search
USPC ............ 248/220.21, 220.22, 221.11, 222.13, 248/222.14, 222.51, 222.52, 223.31, 248/225.21; 403/348, 350
See application file for complete search history.

(56) References Cited

U.S. PATENT DOCUMENTS

| | | | | |
|---|---|---|---|---|
| 1,915,479 A * | 6/1933 | Smith | .................... | A47K 10/10 248/222.14 |
| 1,940,888 A * | 12/1933 | Smith | .................... | E05B 1/0015 248/222.14 |
| 2,138,647 A * | 11/1938 | Schofield | ................ | B60R 7/085 224/401 |
| 2,144,602 A * | 1/1939 | Balmer | ................ | A47B 96/061 248/222.13 |
| 2,195,013 A * | 3/1940 | Rastetter | .................... | F16B 7/22 174/45 R |
| 2,330,591 A * | 9/1943 | Kendall | .................... | A47K 1/08 248/222.14 |
| 2,732,159 A * | 1/1956 | Connors | ................ | A47K 10/10 222/180 |
| 2,790,616 A * | 4/1957 | Cardinal, Jr. | ......... | A47F 5/0823 248/220.43 |
| 3,036,803 A * | 5/1962 | Fiebelkorn | ............. | A47K 10/10 248/221.11 |
| 3,128,851 A * | 4/1964 | Deridder et al. | ......... | E04C 2/08 52/588.1 |
| 3,319,060 A * | 5/1967 | Bartley | .................... | F21V 21/02 248/222.11 |
| 3,829,050 A * | 8/1974 | Brautaset | ............. | E04F 10/0662 248/222.14 |
| 3,949,960 A * | 4/1976 | McKee | .................... | B60P 3/343 248/220.21 |
| 4,456,286 A | 6/1984 | Jamar | | |
| 4,662,593 A * | 5/1987 | Shames | .................... | A47K 10/10 248/201 |
| 4,705,244 A * | 11/1987 | Saotome | .................. | F16L 3/223 248/222.51 |
| 4,846,354 A * | 7/1989 | Adams | .................. | A47F 5/0846 211/41.12 |
| 8,973,878 B2 * | 3/2015 | Thompson | ............. | A47G 1/175 248/221.11 |
| 2007/0007409 A1 * | 1/2007 | Huang | .................... | F16M 13/02 248/220.21 |
| 2010/0108837 A1 * | 5/2010 | Felton | .................. | A47B 96/067 248/221.11 |
| 2010/0127141 A1 * | 5/2010 | Chan | .................... | H05K 7/1492 248/220.22 |
| 2011/0140499 A1 * | 6/2011 | Masters | .................... | A47C 9/06 297/440.1 |
| 2011/0174939 A1 | 7/2011 | Taylor | | |

OTHER PUBLICATIONS

International Search Report and Written Opinion, Application No. PCT/EP2015/054851, dated May 27, 2015, 8 pages.

Office Action issued in application No. 15709150.5; dated Aug. 30, 2018; 04 pages.

* cited by examiner

FIG. 1 (*Existing art*)

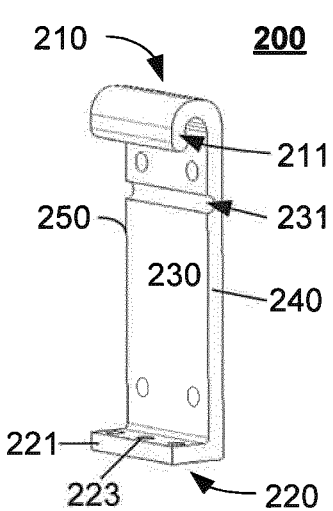
FIG. 2
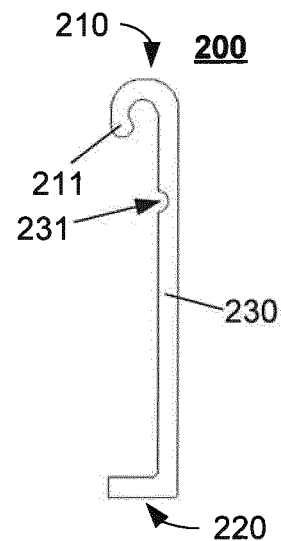
FIG. 3
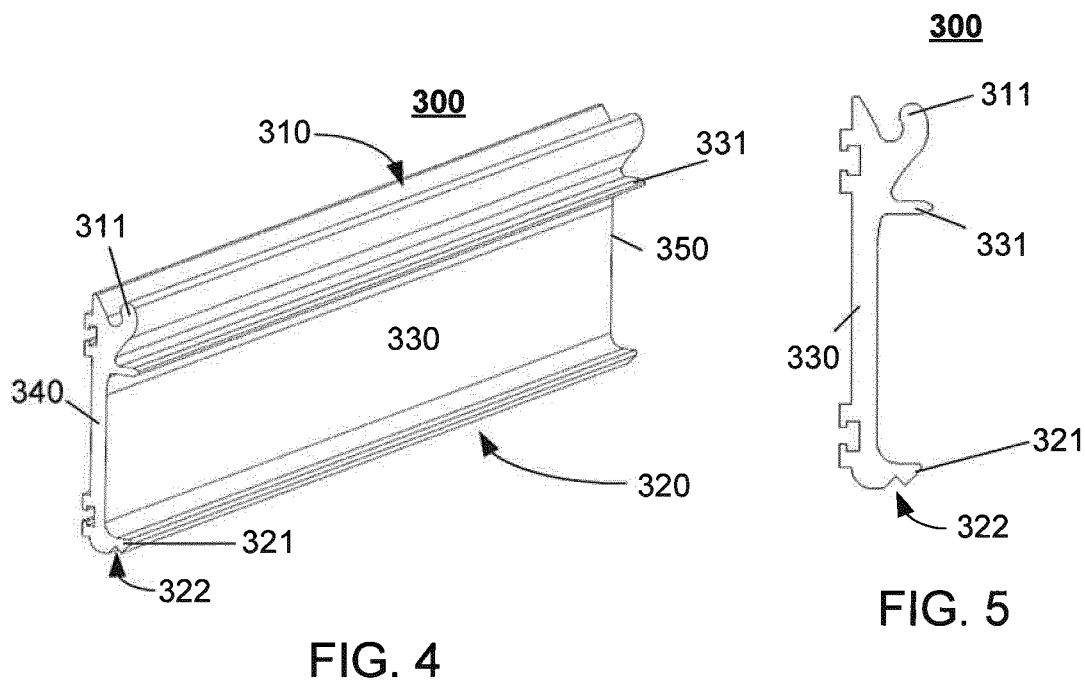
FIG. 4
FIG. 5

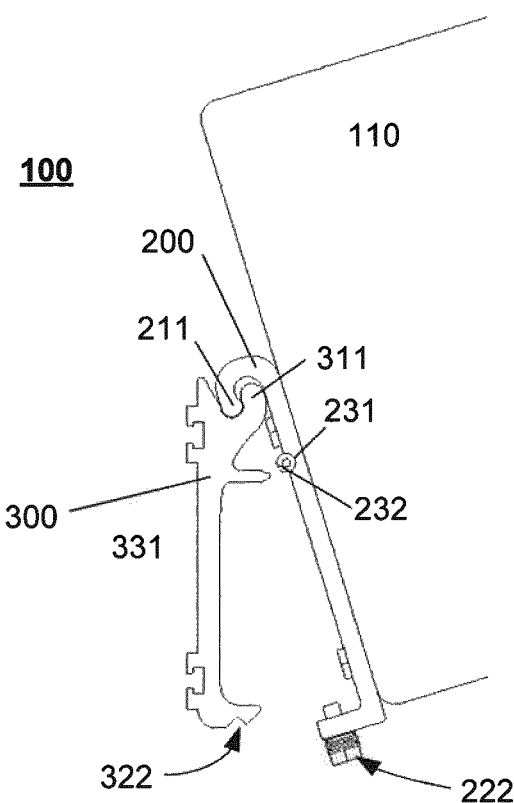
FIG. 6
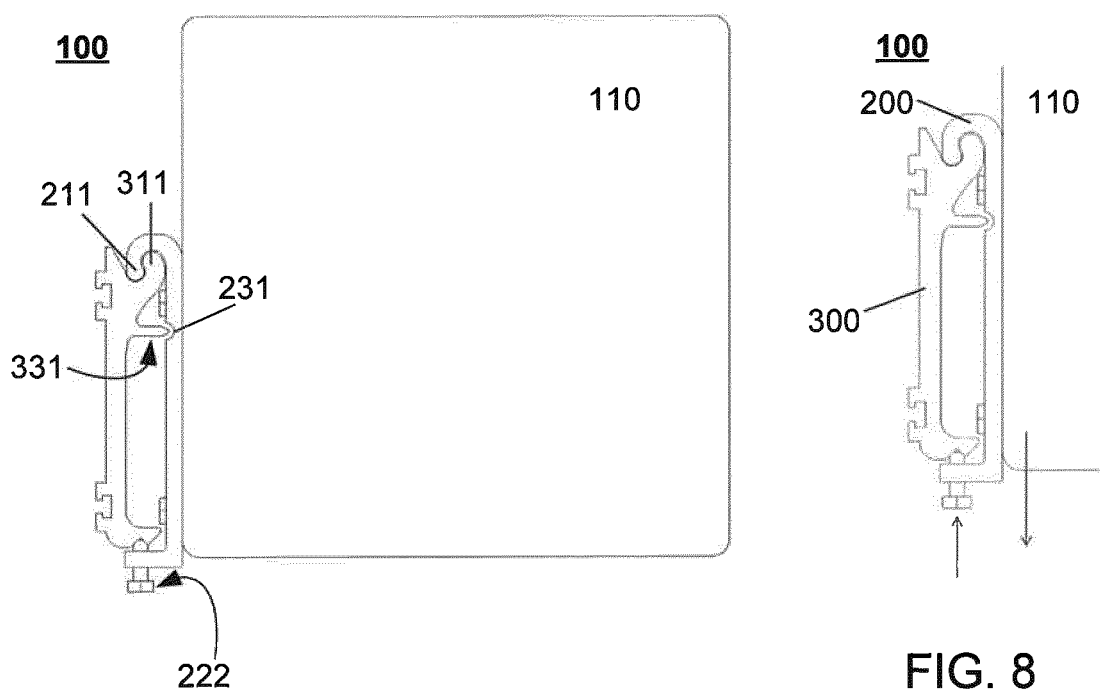
FIG. 7
FIG. 8

MOUNTING OF A TELECOMMUNICATION EQUIPMENT TO A STRUCTURE

CROSS-REFERENCE TO RELATED APPLICATIONS

This application is a National stage of International Application No. PCT/EP2015/054851, filed Mar. 9, 2015, which claims priority to U.S. Application No. 61/986,490, filed Apr. 30, 2014, which are hereby incorporated by reference.

TECHNICAL FIELD

Embodiments presented herein relate to the mounting of telecommunication equipment, e.g. a telecommunication cabinet, to a structure. More particularly, the disclosure presents a mounting bracket intended for the mounting of telecommunication equipment to a structure, such as a wall or a pole. Also, the disclosure presents a mounting rail intended for the mounting of telecommunication equipment to a structure, such as a wall or pole. Still further, the disclosure presents a mounting system that comprises the above-mentioned mounting bracket and the above-mentioned mounting rail.

BACKGROUND

FIG. 1 shows how telecommunication equipment, here in the form of telecommunication cabinets, may be mounted to a structure such as a wall or a pole. The telecommunication equipment may for example come in the form of Remote Radio Units (RRUs). The way of mounting as shown in FIG. 1 may provide many advantages when mounting telecommunication equipment at wall or at a pole of a telecommunication site. For example, the way of mounting disclosed in FIG. 1 is flexible and inexpensive.

There is currently a general trend towards increasing the total number of telecommunication equipment that needs to be installed at a telecommunication site. A reason for this trend is the trend of increasing data usage. When the data usage is increasing the demand for more telecommunication equipment in the form of base stations, RRUs, etc. is increasing too. When more and more telecommunication equipment need to be installed at a telecommunication site today's ways of mounting telecommunication equipment to a structure, such as a wall or a pole, may become inadequate.

SUMMARY

It is in view of these considerations and others that the various embodiments disclosed herein have been made. A general object addressed by the embodiments disclosed herein is therefore to provide for a more flexible mounting of telecommunication equipment to a structure. Advantageously, the embodiments should also be inexpensive. Still further, it would be advantageous if the embodiments allow for the mounting of more telecommunication equipment in an easy manner.

In a first aspect, this disclosure presents a mounting bracket for mounting telecommunication equipment to a structure, such as a wall or a pole. The mounting bracket comprises an upper end and an opposite lower end. A surface between the upper end and the opposite lower end is adapted to abut the telecommunication equipment. Furthermore, the mounting bracket comprises a first side which extends between the upper end and the opposite lower end. Also, the mounting bracket comprises a second side which extends between the upper end and the lower second end.

The upper end has an essentially semi-circular protrusion extending in a direction away from the surface adapted to abut the telecommunication equipment. The essentially semi-circular protrusion is also adapted to pivotally engage with a corresponding hook-like protrusion of a mounting rail in a locking manner.

The lower opposite end comprises a protrusion that is substantially perpendicular to said surface and extends in a direction away from the surface adapted to abut the telecommunication equipment. Furthermore, the protrusion comprises at least one (i.e. one or several) fastener which is adapted to engage with a corresponding end of the mounting rail such that the mounting rail is lockable to the mounting bracket by means of the protrusion and the essentially semi-circular protrusion.

The surface adapted to abut the telecommunication equipment may comprise a recess that extends in a longitudinal direction from the first side to the second side and wherein the recess is adapted to receive a protrusion of the mounting rail in a male-female connection manner. For example, the recess may comprise a damper that extends along the recess. The damper may e.g. be an elastomeric damper.

The at least one fastener may be a screw that is provided in a bore hole of said protrusion. Alternatively, the at least one fastener is may be a pin that is provided in a bore hole of said protrusion.

For instance, the essentially semi-circular protrusion may comprise several recesses that collectively form a saw tooth pattern.

Preferably, but not necessarily, the mounting bracket is made of aluminum.

In a second aspect, this disclosure presents a mounting rail for mounting telecommunication equipment to a structure, such as a wall or a pole. The mounting rail is removably, or releasably, attachable to the mounting bracket according to the above-mentioned first aspect in a locking manner. The mounting rail comprises an upper end and an opposite lower end, wherein a surface between the upper end and the opposite lower end is removably attachable to said structure where the telecommunication equipment is intended to be mounted. The mounting rail further comprises a first side which extends between the upper end and the opposite lower end. Also, the mounting rail comprises a second side which extends between the upper end and the opposite lower end.

The upper end comprises a hook-like protrusion that extends upwardly. The hook-like protrusion is also adapted to pivotally engage with an essentially semi-circular protrusion of the mounting bracket in a locking manner.

The opposite lower end comprises a protrusion that is substantially perpendicular to said surface. The protrusion comprises at least one recess on its lower side. The at least one recess is adapted to receive at least one fastener of the mounting bracket such that the mounting rail can be attached to the mounting bracket in a locking manner by means of the protrusion and the hook-like protrusion.

The above-mentioned surface may comprise a protrusion that extends in a longitudinal direction from the first side to the second side. This protrusion may be adapted to engage with a recess of the mounting bracket in a male-female connection manner.

Alternatively, said surface may comprise a protrusion that extends in a longitudinal direction from the first side to the second side and wherein the protrusion has an L-shape such that an outer portion of the protrusion extends upwardly towards the upper end.

The hook-like protrusion may comprise several recesses that collectively form a saw tooth pattern.

Preferably, but not necessarily, the mounting bracket is made of light metal, e.g. aluminum.

In a third aspect, this disclosure presents a mounting system for mounting telecommunication equipment to a structure. The mounting system comprises a mounting bracket according to the first aspect and a mounting rail according to the second aspect.

In a fourth aspect, this disclosure presents a mounting bracket for mounting telecommunication equipment to a structure, such as a wall or a pole. The mounting bracket comprises an upper end and an opposite lower end. A surface between the upper end and the opposite lower end is adapted to abut the telecommunication equipment. Furthermore, the mounting bracket comprises a first side which extends between the upper end and the opposite lower end. Also, a second side extends between the upper end and the lower second end.

The upper end has an essentially semi-circular protrusion extending in a direction away from the surface adapted to abut the telecommunication equipment. The essentially semi-circular protrusion is adapted to pivotally engage with a corresponding hook-like protrusion of a mounting rail in a locking manner.

The lower opposite end comprises a protrusion that is substantially perpendicular to said surface and extends in a direction away from the surface adapted to abut the telecommunication equipment. This protrusion is provided with at least one fastener which is adapted to join a corresponding end of the mounting rail such that the mounting rail is securely lockable to the mounting bracket.

The at least one fastener may comprise at least one threaded bolt-and-nut arrangement.

In one embodiment, said protrusion comprises a hole for receiving the at least one threaded bolt-and-nut arrangement. Thus, the at least one bolt-and-nut arrangement can be provided in said hole. For example, said hole may be a hole which extends along the protrusion in a direction from the first side to the second side.

Advantageously, the mounting bracket may be made of aluminum.

In a fifth aspect, this disclosure presents a mounting rail for mounting telecommunication equipment to a structure, such as a wall or a pole. The mounting rail is removably attachable to a mounting bracket according to the fourth aspect in a locking manner. The mounting rail comprises an upper end and an opposite lower end. A surface between the upper end and the opposite lower end is removably attachable to said structure where the telecommunication equipment is intended to be mounted. Furthermore, the mounting rail comprises a first side which extends between the upper end and the opposite lower end as well as a second side which extends between the upper end and the opposite lower end.

The upper end comprises a hook-like protrusion that extends upwardly and which is adapted to pivotally engage with an essentially semi-circular protrusion of the mounting bracket in a locking manner.

The opposite lower end comprises a protrusion that is substantially perpendicular to said surface, wherein the protrusion comprises at least one opening. This at least one opening is adapted to receive at least one fastener for securely locking the mounting rail to the mounting bracket.

The at least one fastener may comprise at least one threaded bolt-and-nut arrangement.

In one embodiment, said at least one opening comprises at least one hole for receiving the at least one bolt-and-nut arrangement. In an alternative embodiment, said at least one opening comprises at least one notch for receiving the at least one bolt-and-nut arrangement.

Advantageously, the mounting rail may be made of aluminum.

In a sixth aspect, this disclosure presents a mounting system for mounting telecommunication equipment to a structure. The mounting system comprises a mounting bracket according to the fourth aspect and a mounting rail according to the fifth aspect.

BRIEF DESCRIPTION OF THE DRAWINGS

These and other aspects, features and advantages will be apparent and elucidated from the following description of various embodiments, reference being made to the accompanying drawings, in which:

FIG. 2 is a perspective view of a portion of a mounting bracket according to an embodiment;

FIG. 3 is a side view of the mounting bracket of FIG. 2;

FIG. 4 is a perspective view of a mounting rail according to an embodiment;

FIG. 5 is a side view of the mounting rail of FIG. 4;

FIGS. 6-8 are side views of the mounting bracket of FIGS. 2-3 and the mounting rail of FIGS. 4-5;

DETAILED DESCRIPTION

The present invention will now be described more fully hereinafter. The invention may, however, be embodied in many different forms and should not be construed as limited to the embodiments set forth herein; rather, these embodiments are provided by way of example so that this disclosure will be thorough and complete, and will fully convey the scope of the invention to those persons skilled in the art. Like reference numbers refer to like elements or method steps throughout the description.

Figure 12:
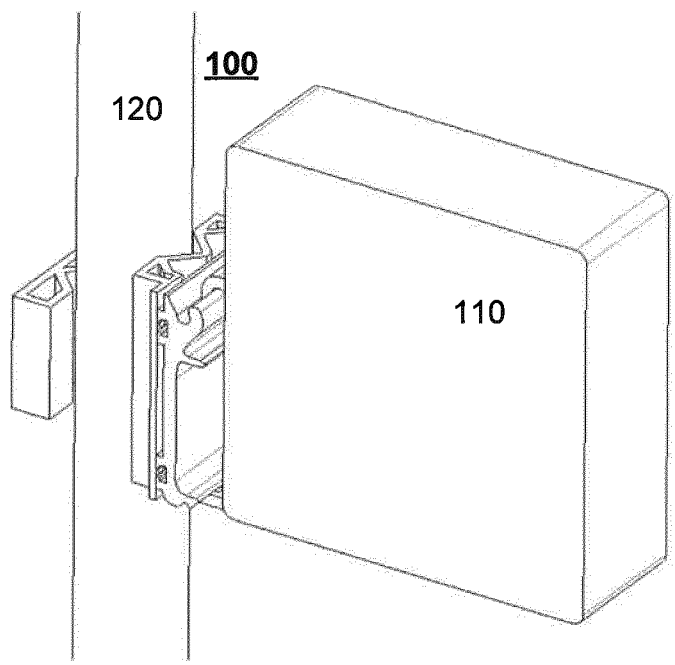
Figure 13:
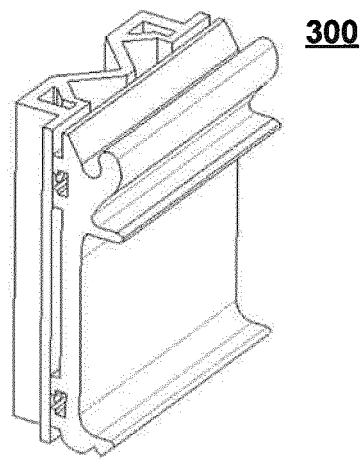

With reference to FIGS. 2-16, a first embodiment of a mounting system 100 for mounting telecommunication equipment 110 to a structure 120 will be presented. The structure 120 may be a pole (see e.g. FIGS. 12 and 14). Alternatively, the structure 120 may e.g. be a wall. The structure 120 may be part of a telecommunication site. The telecommunication site is a site intended for the installation of telecommunication equipment, such as telecommunication cabinets, etcetera. The telecommunication equipment 110 may e.g. comprise one or several RRUs.

Turning now to FIGS. 2-3, a mounting bracket 200 for mounting the telecommunication equipment 110 to the structure 120 will be described. The mounting bracket 200 comprises an upper end 210 and an opposite lower end 220. A surface 230 between the upper end 210 and the opposite lower end 220 is adapted to abut the telecommunication equipment 110. As can be seen in e.g. FIGS. 6 and 7, the surface 230 may also be removably attachable to the telecommunication equipment 110. The mounting bracket 200 also comprises a first side 240 which extends between the upper end 210 and the opposite lower end 220 and a second side 250 which extends between the upper end 210 and the lower second end 220.

The upper end 210 has an essentially semi-circular protrusion 211 extending in a direction away from the surface 230 adapted to abut the telecommunication equipment 110. The essentially semi-circular protrusion 211 is adapted to pivotally engage with a corresponding hook-like protrusion 311 of a mounting rail 300 in a locking manner (see e.g. FIGS. 6-8).

The lower opposite end 220 comprises a protrusion 221 that is substantially perpendicular to the surface 230. This protrusion 221 also extends in a direction away from the surface 230 adapted to abut the telecommunication equipment 110. The protrusion 221 comprises at least one fastener 222, which is adapted to engage with a corresponding end 323 of the mounting rail 300 such that the mounting rail 300 is lockable to the mounting bracket 200 by means of the protrusion 221 and the essentially semi-circular protrusion 211.

As can be seen in the figures, the surface 230 which is adapted to abut the telecommunication equipment 110 may comprise a recess 231. The optional recess 231 extends in a longitudinal direction from the first side 240 to the second side 250. Preferably, but not necessarily, the optional recess 231 extends in the longitudinal direction the whole distance, or length, from the first side 240 to the second side 250. The optional recess 231 is adapted to receive a protrusion 331 of the mounting rail 300 in a male-female connection manner. As can e.g. be seen in FIG. 11 (and FIG. 6), the optional recess 231 may advantageously comprise a damper 232, or dampening means. The dampener 232, or dampening means, may extend along the recess 231. Furthermore, the dampener 232 may be an elastomeric damper 232. An advantage with the provision of the dampener 232 is that the protrusion 331 of the mounting rail 300 may connect to the recess 231 in a male-female connection manner in an increasingly smooth manner. Also, once the telecommunication equipment 110 is mounted to the structure the dampener 232 may provide a dampening effect. This may e.g. be particularly advantageous in geographic locations that may experience earthquakes or in geographic locations that may experience vibrations for other reasons.

In an advantageous embodiment, the at least one fastener 222 is a screw which can be provided in a bore hole 223 of the protrusion 221 (see e.g. FIGS. 6, 7, 8, 10). Alternatively, the at least one fastener 222 may be a pin (not shown) which can be provided in a bore hole 223 of the protrusion 221. Other fastening means could be conceived. For example, an adhesive or glue could be conceived in some embodiments where the telecommunication equipment 110 to be mounted on the structure 120 is e.g. of relatively low weight.

In some embodiments, the essentially semi-circular protrusion 211 may comprise several recesses (not shown) that collectively form a saw tooth pattern. This may have the advantage of strengthening the shock resistance of the mounting system 100 when the mounting bracket 200 is removably attached to the mounting rail 300 in the position as shown for example in FIGS. 7, 8, 12, and 14.

The mounting bracket 200 is preferably, though not necessarily, made of aluminum. Other materials are also conceivable. For example, the mounting bracket 200 may be made of another metal. Alternatively, the mounting bracket 200 may be made of plastic.

With reference to FIGS. 4 and 5, a mounting rail 300 for mounting telecommunication equipment 110 to a structure 120 will now be described. The mounting rail 300 is removably attachable to the mounting bracket 200 in a locking manner.

The mounting rail 300 comprises an upper end 310 and an opposite lower end 320. A surface 330 between the upper end 310 and the opposite lower end 320 is removably attachable to said structure 120 where the telecommunication equipment is intended to be mounted. Furthermore, the mounting rail 300 comprises a first side 340 which extends between the upper end 310 and the opposite lower end 320. Moreover, the mounting rail 300 comprises a second side 350 which extends between the upper end 310 and the opposite lower end 320.

The upper end 310 comprises a hook-like protrusion 311 that extends upwardly and which is furthermore adapted to pivotally engage with the essentially semi-circular protrusion 211 of the mounting bracket 200 in a locking manner. The opposite lower end 320 comprises a protrusion 321 that is substantially perpendicular to the surface 330. The protrusion 321 comprises at least one recess 322 on its lower side 323. The at least one recess 322 is adapted to receive at least one fastener 221 of the mounting bracket 200 such that the mounting rail 300 can be attached to the mounting bracket 200 in a locking manner by means of the protrusion 321 and the hook-like protrusion 311.

In this exemplary embodiment, the surface 330 comprises a protrusion 331 that extends in a longitudinal direction from the first side 340 to the second side 350. Preferably, but not necessarily, the protrusion 331 extends in the longitudinal direction the whole distance, or length, from the first side 340 to the second side 350. The protrusion 331 may thus be adapted to engage with the recess 231 of the mounting bracket 200 in a male-female connection manner.

Figure 14:
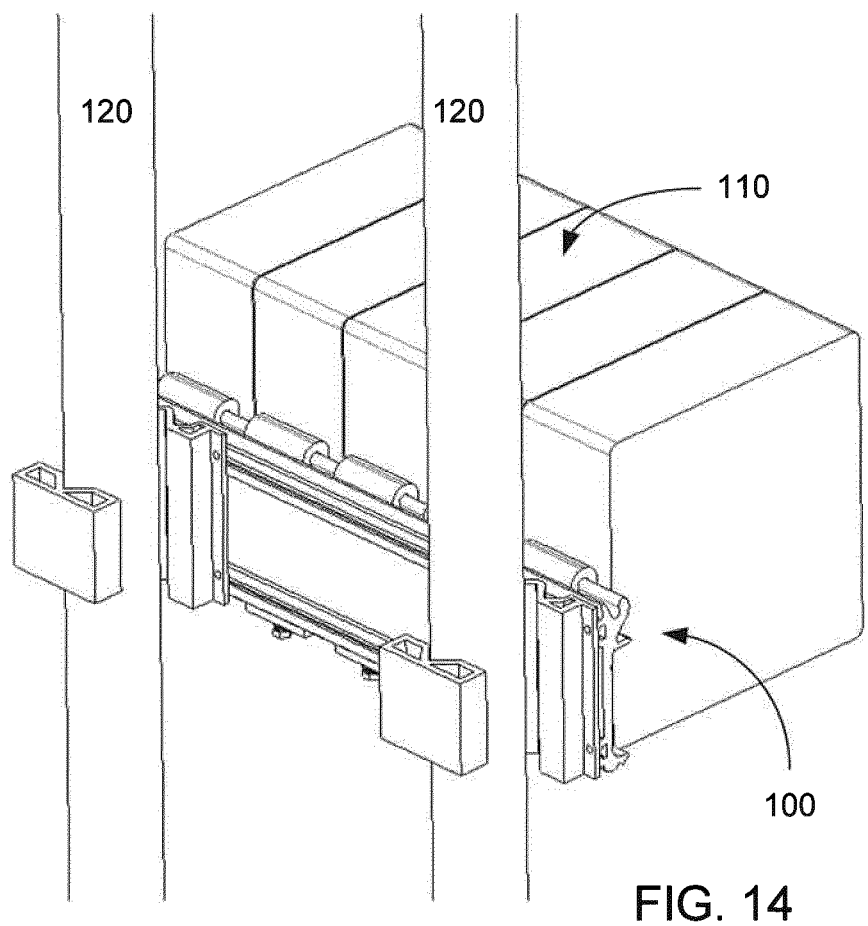
Figure 15:
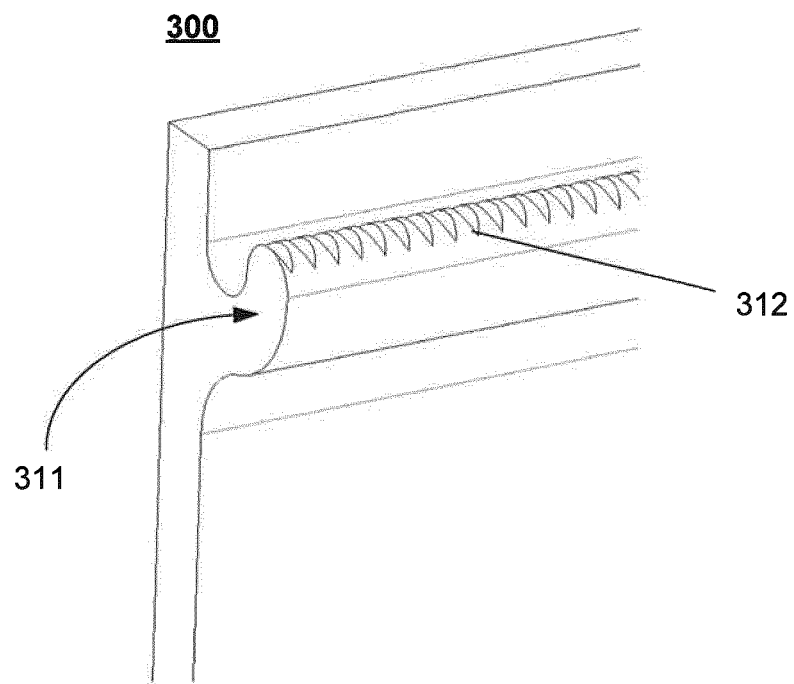

As can be seen in FIG. 15, the hook-like protrusion 311 may advantageously comprise several recesses 312 that collectively form a saw tooth pattern. This may have the advantage of strengthening the shock resistance of the mounting system 100 when the mounting bracket 200 is removably attached to the mounting rail 300 in the position as shown for example in FIGS. 7, 8, 12, and 14.

Preferably, but not necessarily, the mounting bracket 300 is made of aluminum. Other materials are also conceivable. For example, the mounting rail 300 may be made of another metal. Alternatively, the mounting rail 300 may be made of plastic.

As can be seen in FIGS. 6 through 8, it is possible to removably attach telecommunication equipment 110 such as a RRU to the mounting bracket 200. It is also possible to removably attach the mounting rail 300 to the structure 120 where the telecommunication equipment 110 is intended to be installed. After a lifting movement of the mounting bracket 200 (e.g., including the telecommunication equipment 110), it is possible to hook the mounting bracket 200 into the rail (defined by the hook-like protrusion 311) of the mounting rail 300. Once hooked into the position shown in FIG. 6, it is possible to move the telecommunication equipment 110 towards the surface 330 of the mounting rail 300. Once in the position shown in FIGS. 7 and 8, the mounting bracket 200 and the mounting rail 300 can be locked by means of the combination of the least one fastener 222 and the corresponding at least one recess 322 as well as the combination of the essentially semi-circular protrusion 211 and the corresponding hook-like protrusion 311.

Figure 1:
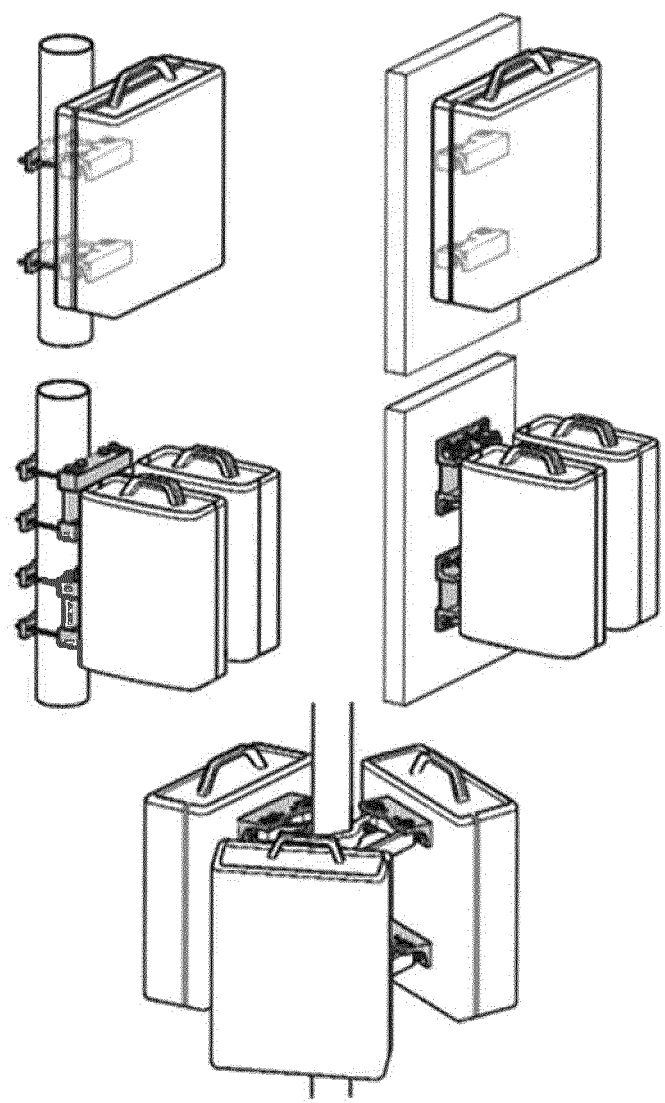
FIG. 1 shows how telecommunication equipment, here in the form of telecommunication cabinets, may be mounted to a structure such as a wall or a pole.
Figure 9:
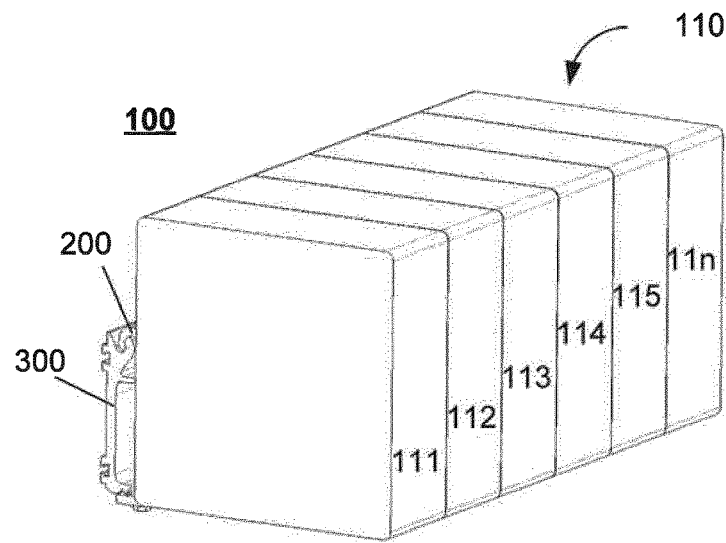
FIGS. 9-16 show various example embodiments of the mounting bracket and the mounting rail of FIGS. 2-8.
Figure 10:
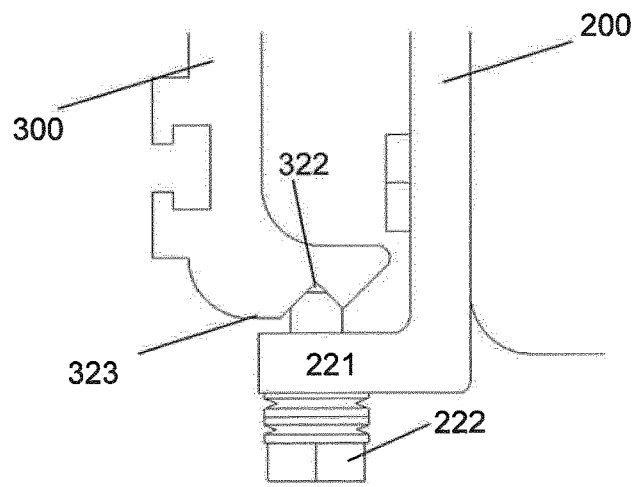
Figure 11:
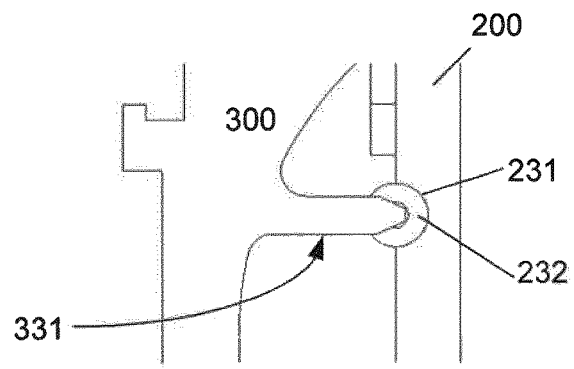
Figure 16:
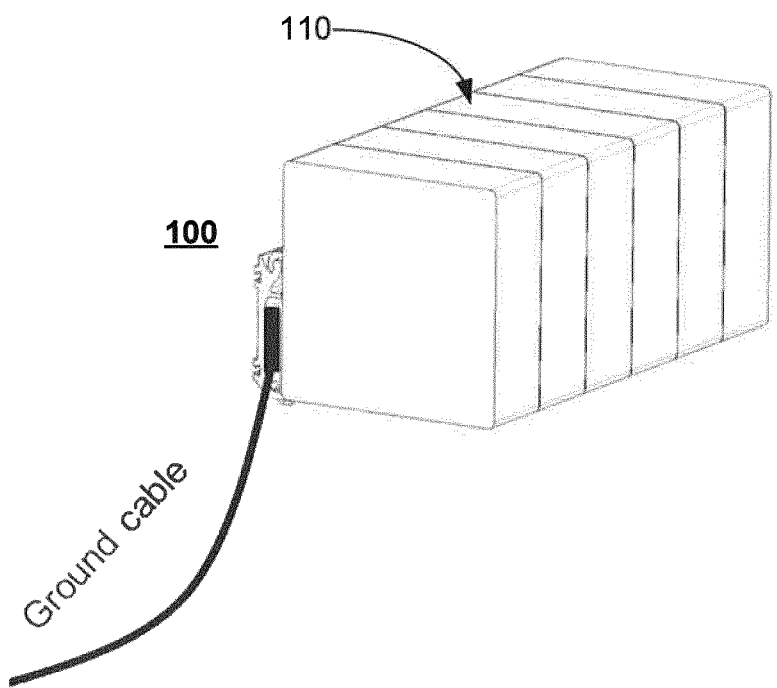

An advantage of this embodiment is that several telecommunication equipment 111-11$n$ may be mounted on a structure using the mounting system 100, see e.g. FIGS. 9, 14 and 16. This may be important in the future when there will be an increasing demand on installing more telecommunication equipment at the telecommunication sites.

Turning now to FIGS. 17-30, a second embodiment of a mounting system 400 for mounting telecommunication equipment 110 to a structure 120 will be described. The structure 120 may be a pole (see e.g. FIGS. 24, 25, 26, 29). Alternatively, the structure 120 may e.g. be a wall. The structure 120 may be part of a telecommunication site. Again, the telecommunication site is generally a site intended for the installation of telecommunication equipment, such as telecommunication cabinets, etcetera. As mentioned previously, the telecommunication equipment 110 may e.g. comprise one or several RRUs.

Figures 17, 18:
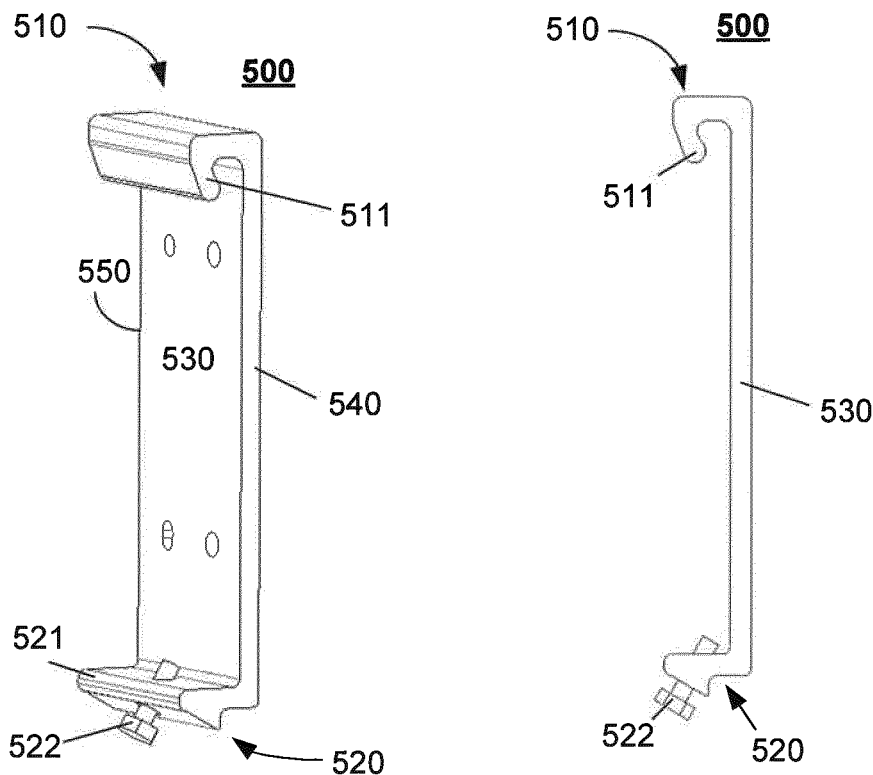
FIG. 17 is a perspective view of a portion of a mounting bracket according to another embodiment.
FIG. 18 is a side view of the mounting bracket of FIG. 17.

Turning now to FIGS. 17-18, a mounting bracket 500 for mounting the telecommunication equipment 110 to the structure 120 will be described. The mounting bracket 500 comprises an upper end 510 and an opposite lower end 520. A surface 530 between the upper end 510 and the opposite lower end 520 is adapted to abut the telecommunication equipment 110. The surface 530 may also be releasably attachable to the telecommunication equipment 110. The mounting bracket 500 also comprises a first side 540 which extends between the upper end 510 and the opposite lower end 520 and a second side 550 which extends between the upper end 510 and the lower second end 520.

The upper end 510 has an essentially semi-circular protrusion 511 extending in a direction away from the surface 530 adapted to abut the telecommunication equipment 110. The essentially semi-circular protrusion 511 is adapted to pivotally engage with a corresponding hook-like protrusion 611 of a mounting rail 600 in a locking manner.

The lower opposite end 520 comprises a protrusion 521 that is substantially perpendicular to the surface 530. The protrusion 521 also extends in a direction away from the surface 530 adapted to abut the telecommunication equipment 110. The protrusion 521 comprises at least one fastener 522, which is adapted to engage with a corresponding end 623 of the mounting rail 600 such that the mounting rail 600 is lockable to the mounting bracket 500 by means of the protrusion 521 and the essentially semi-circular protrusion 511.

In an advantageous embodiment, the at least one fastener 522 is a screw which can be provided in a bore hole of the protrusion 521 (see e.g. FIGS. 17, 18, 21, 22). Alternatively, the at least one fastener 522 may be a pin (not shown) which can be provided in a bore hole of the protrusion 521.

Other fastening means could be conceived. For example, an adhesive or glue could be conceived in some embodiments where the telecommunication equipment 110 to be mounted on the structure 120 is e.g. of relatively low weight.

In some embodiments, the essentially semi-circular protrusion 511 may comprise several recesses (not shown) that collectively form a saw tooth pattern. This may have the advantage of strengthening the shock resistance of the mounting system 400 when the mounting bracket 500 is removably attached to the mounting rail 600 in the position as shown for example in FIGS. 22, 23, 24, 25 and 29.

The mounting bracket 500 is preferably, though not necessarily, made of aluminum. Other materials are also conceivable. For example, the mounting bracket 500 may be made of another metal. Alternatively, the mounting bracket 500 may be made of plastic.

Figures 19, 20:
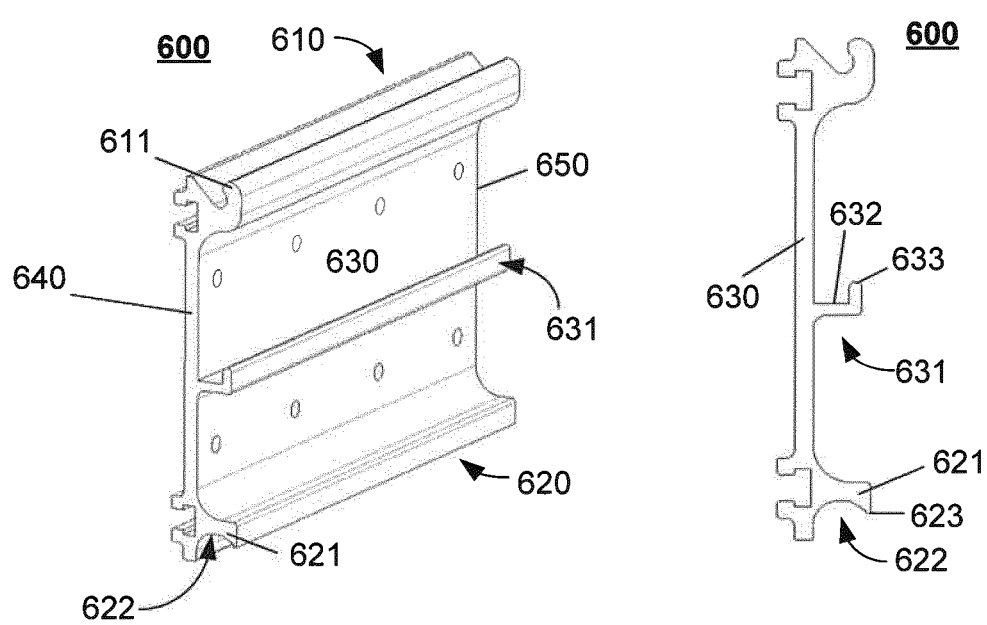
FIG. 19 is a perspective view of a mounting rail according to another embodiment.
FIG. 20 is a side view of the mounting rail of FIG. 19.

With reference to FIGS. 19 and 20, a mounting rail 600 for mounting telecommunication equipment 110 to a structure 120 will now be described. The mounting rail 600 is removably attachable to the mounting bracket 500 in a locking manner.

The mounting rail 600 comprises an upper end 610 and an opposite lower end 620. A surface 630 between the upper end 610 and the opposite lower end 620 is removably attachable to said structure 120 where the telecommunication equipment is intended to be mounted. Furthermore, the mounting rail 600 comprises a first side 640 which extends between the upper end 610 and the opposite lower end 620. Moreover, the mounting rail 600 comprises a second side 650 which extends between the upper end 610 and the opposite lower end 620.

The upper end 610 comprises a hook-like protrusion 611 that extends upwardly and which is furthermore adapted to pivotally engage with the essentially semi-circular protrusion 511 of the mounting bracket 500 in a locking manner. The opposite lower end 620 comprises a protrusion 621 that is substantially perpendicular to the surface 630. The protrusion 621 comprises at least one recess 622 on its lower side 623. The at least one recess 622 is adapted to receive at least one fastener 521 of the mounting bracket 500 such that the mounting rail 600 can be attached to the mounting bracket 500 in a locking manner by means of the protrusion 621 and the hook-like protrusion 611.

Figure 31:
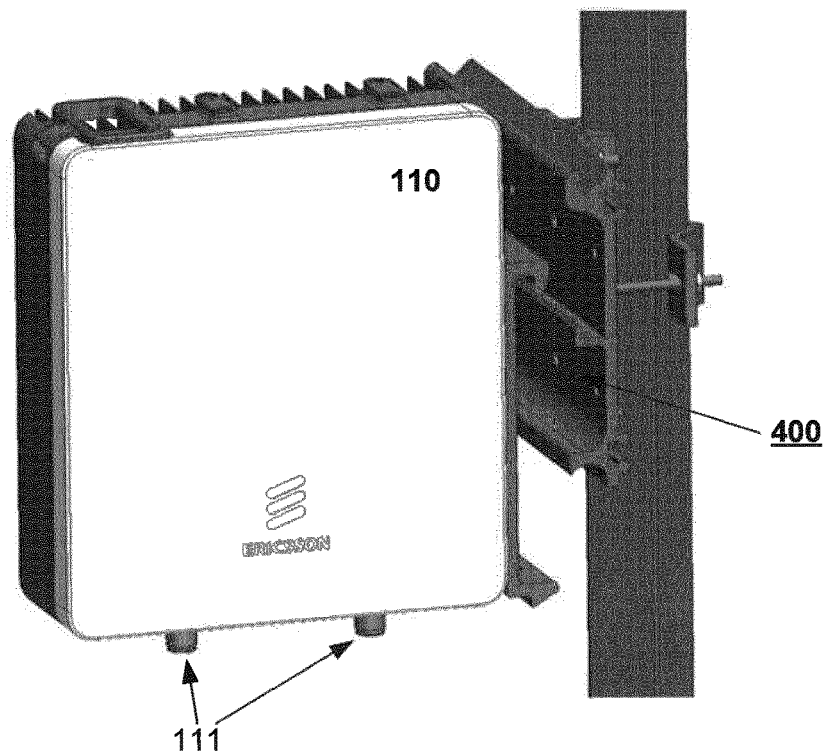
Figure 32:
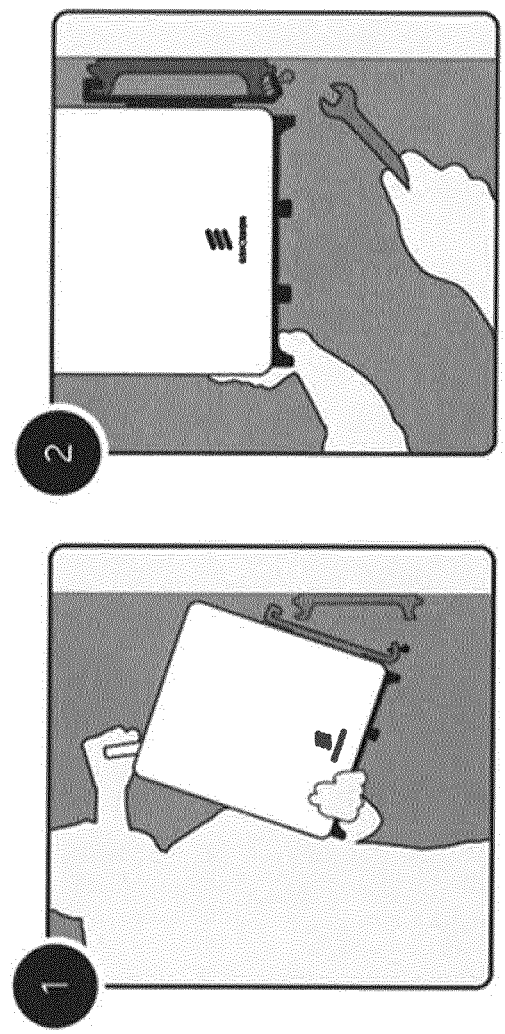
FIG. 32 schematically illustrates an exemplary two-step procedure for mounting telecommunication equipment to a structure, e.g. a wall.
Figure 33:
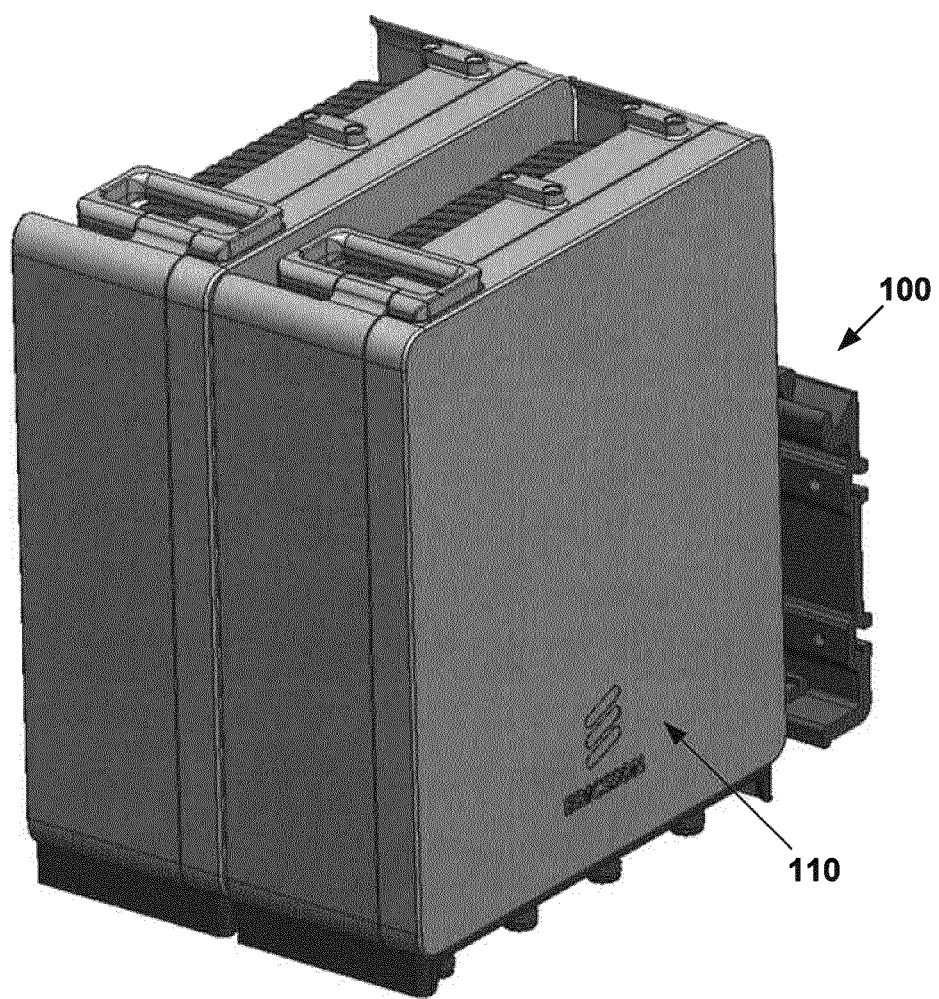
FIG. 33 schematically illustrates still another embodiment of a mounting system comprising a mounting bracket and a mounting rail for mounting telecommunication equipment to a structure.

In this embodiment, the surface 630 comprises a protrusion 631 that extends in a longitudinal direction from the first side 640 to the second side 650. The protrusion 631 has an L-shape 632 such that an outer portion 633 thereof extends upwardly towards the upper end 610. FIGS. 31 and 32 illustrate an advantage that is achieved by means of the protrusion 631 with the L-shape 632. The L-shaped protrusion 631 may allow for removably attaching the mounting bracket 500 (e.g., including the telecommunication equipment 110) to the mounting rail 600 in an intermediate position (see FIGS. 31 and 32). This may be particularly advantageous when installing telecommunication equipment 110 at a telecommunication site as this may e.g. facilitate the cabling, or wiring, during the installation. For example, this may also allow for a more flexible solution which makes it easier to access the contact interface 111 of the telecommunication equipment 110 during installation.

In the figures, the outer portion 633 (or shorter leg) of the L-shape 632 is shown to be essentially perpendicular to the longer leg of the L-shape 632. It should be appreciated that it is not necessary that there are exactly 90 degrees between the outer portion 633 (or shorter leg) and the longer leg of the L-shape 632. The angle may e.g. be 60, 70, 80, 85, 95, 100, 110 or 120 degrees to list a few alternative angles.

The hook-like protrusion 611 may advantageously comprise several recesses that collectively form a saw tooth pattern. This may have the advantage of strengthening the shock resistance of the mounting system 400 when the mounting bracket 500 is removably attached to the mounting rail 600 in the position as shown for example in FIGS. 21, 22, 23, 24, 25, and 29.

Preferably, but not necessarily, the mounting bracket 600 is made of aluminum. Other materials are also conceivable. For example, the mounting rail 600 may be made of another metal. Alternatively, the mounting rail 600 may be made of plastic.

Figure 21:
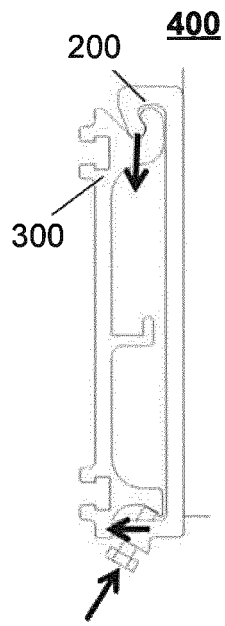
FIGS. 21-22 are side views of the mounting bracket of FIGS. 17-18 and the mounting rail of FIGS. 19-20.
Figure 22:
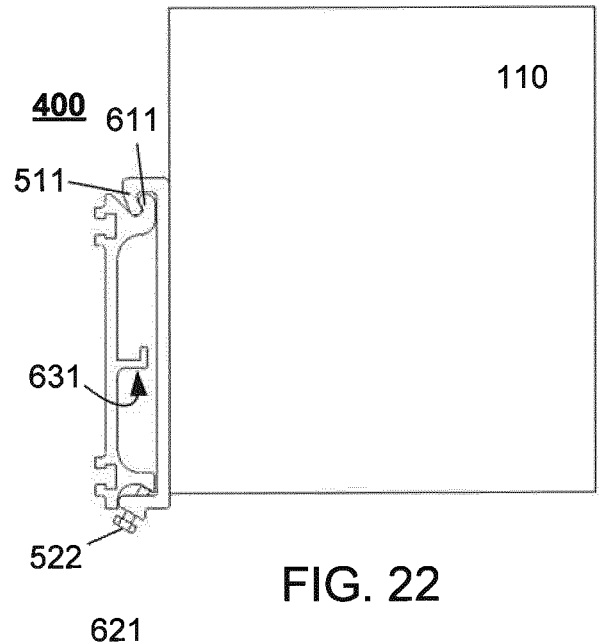

As is foreshadowed in FIGS. 21 and 22, it is possible to removably attach telecommunication equipment 110 such as a RRU to the mounting bracket 500. It is also possible to removably attach the mounting rail 600 to the structure 120 where the telecommunication equipment 110 is intended to be installed. After a lifting movement of the mounting bracket 500 (e.g., including the telecommunication equipment 110), it is possible to hook the mounting bracket 500 into the rail (defined by the hook-like protrusion 611) of the mounting rail 600. Once hooked into the rail, it is possible to move the telecommunication equipment 110 towards the surface 630 of the mounting rail 600. Once in the position shown in FIGS. 21 and 22, the mounting bracket 500 and the mounting rail 600 can be locked by means of the combination of the least one fastener 522 and the corresponding at least one recess 622 as well as the combination of the essentially semi-circular protrusion 511 and the corresponding hook-like protrusion 611. FIG. 32 also foreshadows this in an exemplary two-step procedure.

Figure 23:
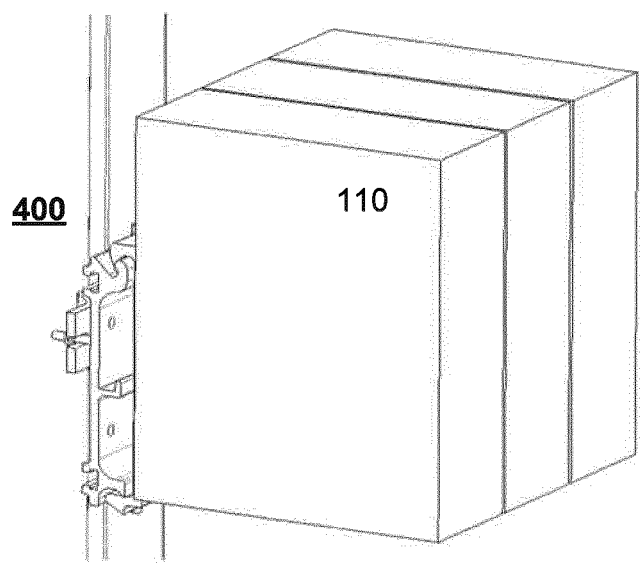
FIGS. 23-31 show various example embodiments of the mounting bracket and the mounting rail of FIGS. 17-22.
Figure 24:
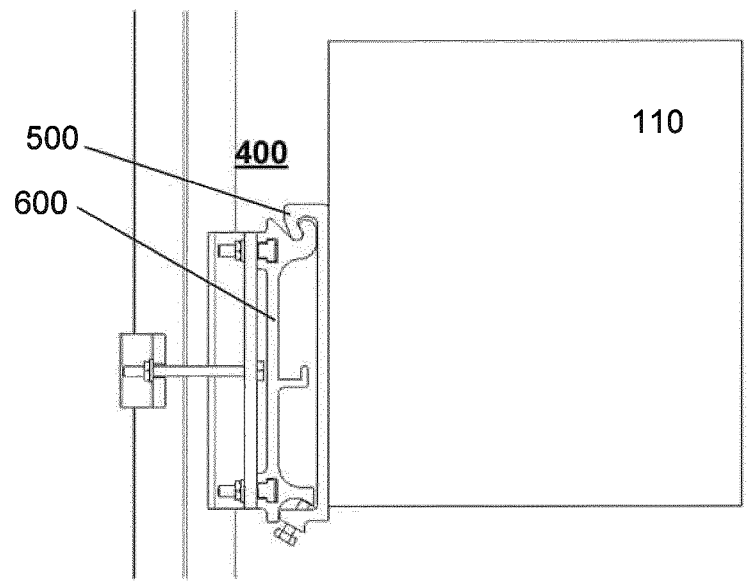
Figure 25:
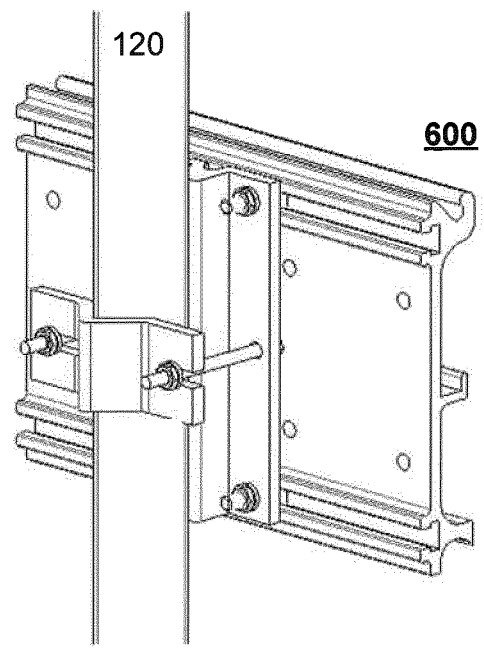
Figure 26:
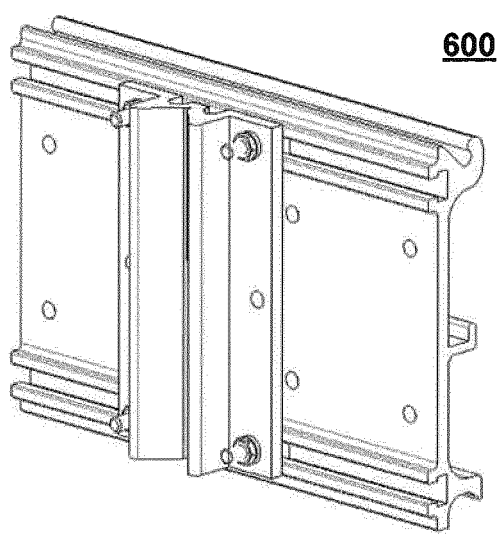
Figure 27:
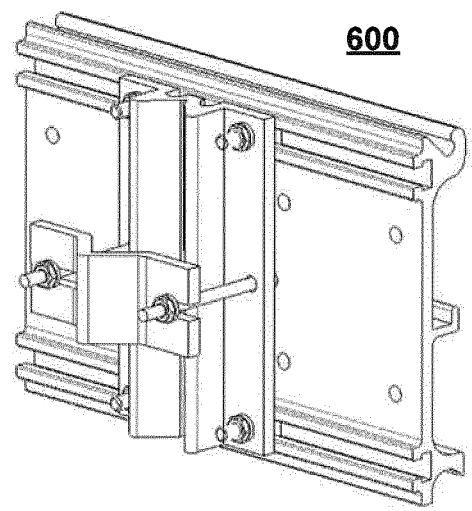
Figure 28:
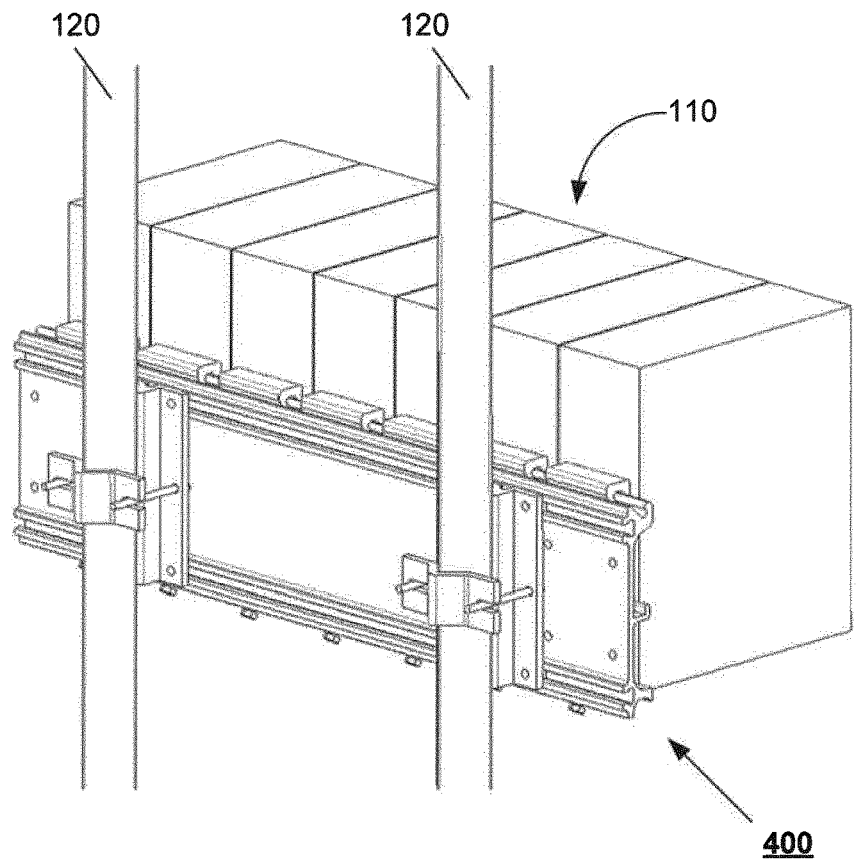
Figure 29:
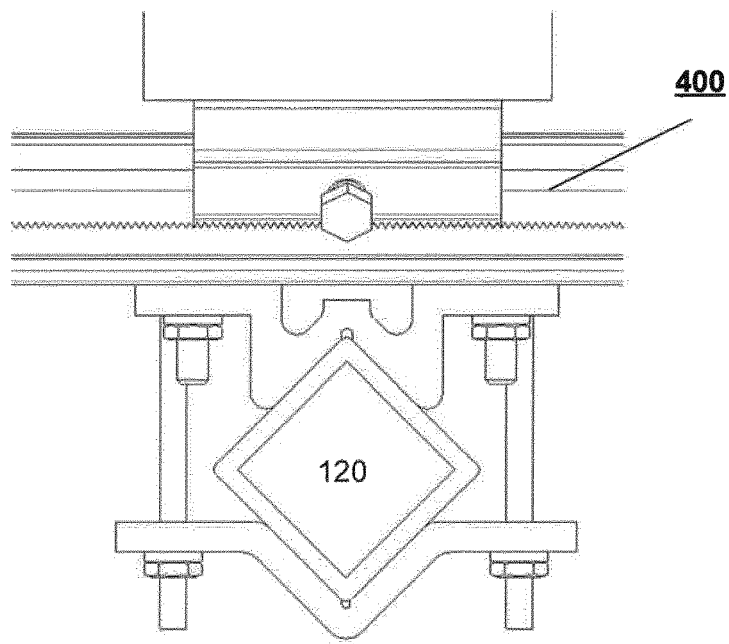
Figure 30:
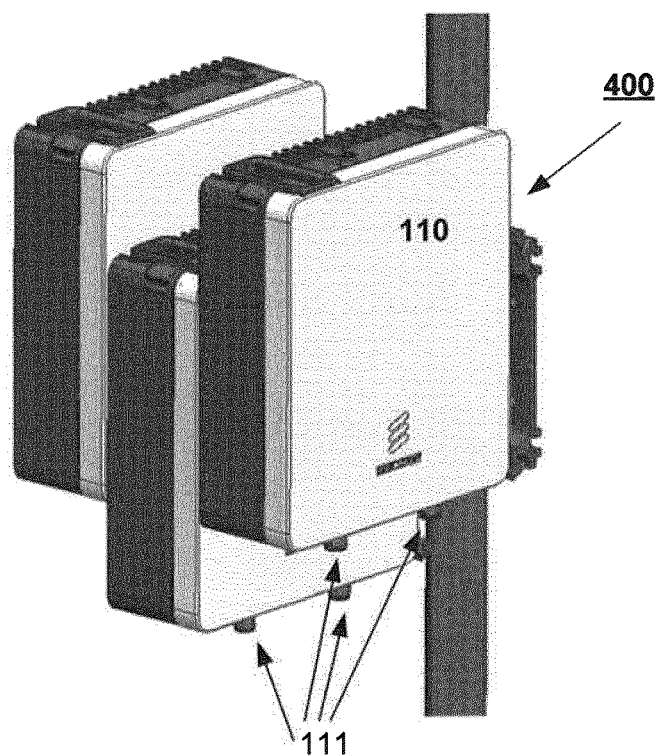

An advantage of this embodiment is that several telecommunication equipment 111-11n may be mounted on a structure using the mounting system 400, see e.g. FIGS. 23, 24, and 29. This may be important in the future when there will be an increasing demand on installing more telecommunication equipment at the telecommunication sites.

With reference to FIGS. 33-37, still another embodiment of a mounting system 100 for mounting telecommunication equipment 110 to a structure 120 will be presented. As described earlier, the structure 120 may e.g. be a pole or a wall. Again, the structure 120 may be part of a telecommunication site. The telecommunication site is typically a site intended for the installation of telecommunication equipment, such as telecommunication cabinets, etcetera. The telecommunication equipment 110 may e.g. comprise one or several RRUs.

Figure 34C:
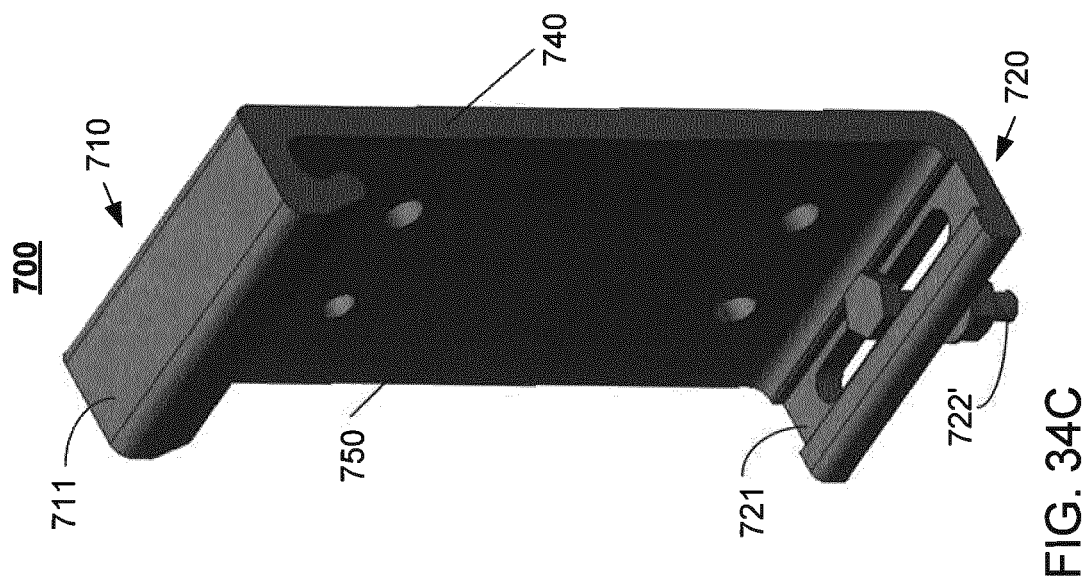
FIG. 34 schematically illustrates an embodiment of a mounting bracket which can be used in the mounting system shown in FIG. 33.

Turning now to FIG. 34, a mounting bracket 700 for mounting telecommunication equipment to the structure 120 will be presented. The mounting bracket 700 comprises an upper end 710 and an opposite lower end 720. A surface 730 between the upper end 710 and the opposite lower end 720 is adapted to abut the telecommunication equipment 110. The mounting bracket 700 further comprises a first side 740 which extends between the upper end 710 and the opposite lower end 720. Moreover, the mounting bracket 700 comprises a second side 750 which also extends between the upper end 710 and the lower second end 720.

The upper end 710 has an essentially semi-circular, or hook-like, protrusion 711 extending in a direction away from the surface 730 that is adapted to abut the telecommunication equipment 110. The essentially semi-circular, or hook-like, protrusion 711 is adapted to pivotally engage with a corresponding hook-like protrusion 911 of a mounting rail 900 in a locking manner.

The lower opposite end 720 comprises a protrusion 721 that is substantially perpendicular to the surface denoted 730. The protrusion 721 extends in a direction away from the surface 730 adapted to abut the telecommunication equipment 110. As can be seen in FIGS. 34A-34O, the protrusion 721 may be provided with at least one fastener 722 which is adapted to join a corresponding end of the mounting rail 900 such that the mounting rail 900 is securely lockable to the mounting bracket 700. That is, the protrusion 721 may be provided with at least one fastener 722 which is adapted to join a corresponding end of the mounting rail 900 such that the mounting rail 900 can be securely locked to the mounting bracket 700.

Advantageously, the at least one fastener 722 comprises at least one threaded bolt-and-nut arrangement 722' which can be provided at said protrusion 721.

Figure 34B:
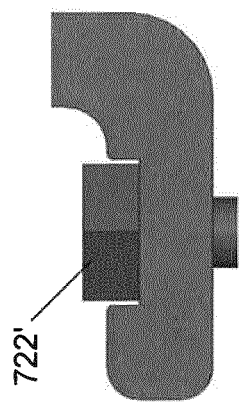
Figure 34A:
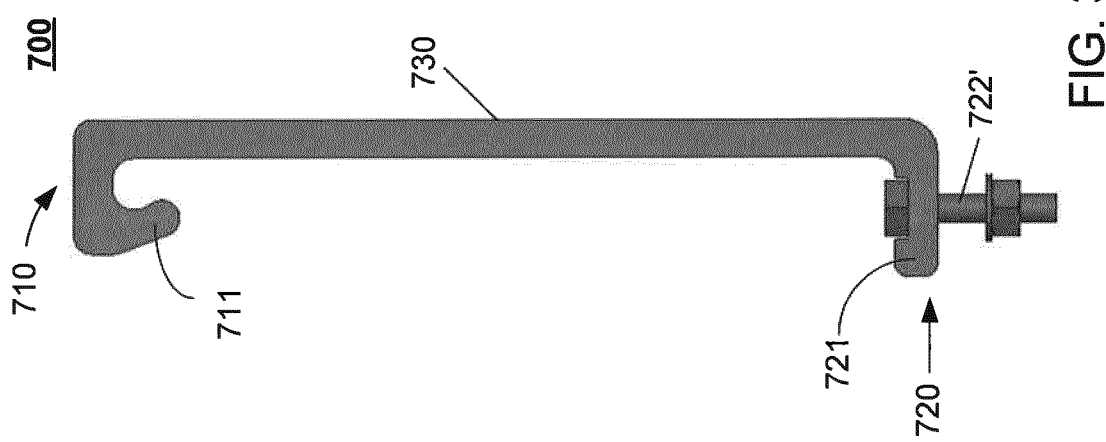
Figure 35B:
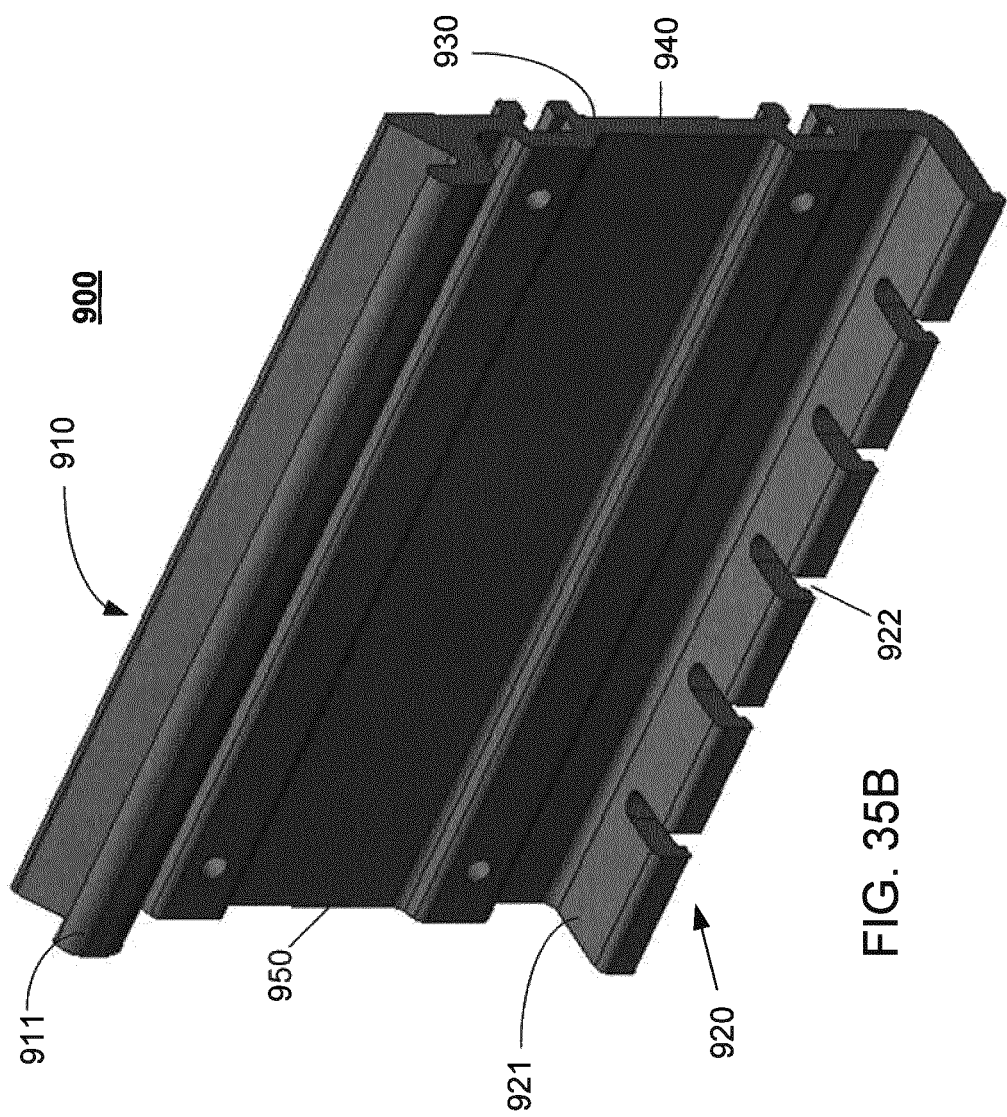
FIG. 35 schematically illustrates an embodiment of a mounting rail which can be used in the mounting system shown in FIG. 33.
Figure 35A:
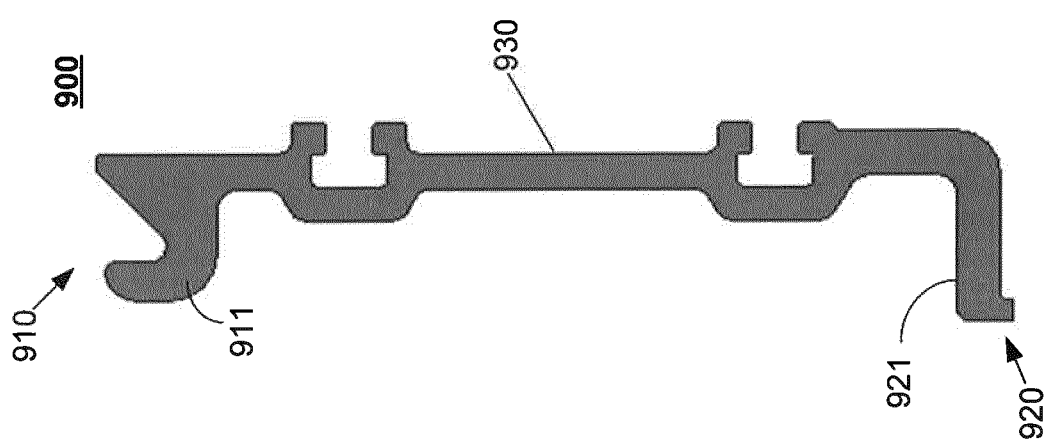

As is schematically illustrated in FIGS. 34B and 34O, respectively, said protrusion 721 may comprise a hole adapted to receive the at least one bolt-and-nut arrangement 722' such that the bolt-and-nut arrangement 722' can be provided in said hole. This hole may be a hole which extends along the longitudinal direction of the protrusion 721, i.e. in a direction from the first side 740 to the second side 750. As will be appreciated, the hole may extend in the longitudinal direction the whole distance, or length, from the first side 740 to the second side 750. Alternatively, the hole could extend along only a portion (or, part) of the distance between the first side 740 and the second side 750. Still further, in alternative embodiments, the protrusion 721 could be provided with several (i.e. two or more) holes. As can be seen in FIGS. 34B and 34O, the protrusion 721 may also be provided with a groove along the hole. This may facilitate fixating the threaded bolt-and-nut arrangement 722' when mounting the mounting bracket 700 to the mounting rail 900.

Advantageously, the mounting bracket 700 is made of a lightweight material. For example, the mounting bracket 700 may be made of aluminum. Other materials are also conceivable. For example, the mounting bracket 700 may be made of another metal. Alternatively, the mounting bracket 700 may be made of plastic.

With reference to FIG. 35, a mounting rail 900 for mounting telecommunication equipment 110 to a structure will now be described. The mounting rail 900 is removably, or releasably, attachable to the mounting bracket 700 shown in FIG. 34. The mounting rail 900 comprises an upper end 910 and an opposite lower end 920. A surface 930 between the upper end 910 and the opposite lower end 920 is removably attachable to said structure 120 where the telecommunication equipment 110 is intended to be mounted. Furthermore, the mounting rail 900 further comprises a first side 940 which extends between the upper end 910 and the opposite lower end 920. Moreover, the mounting rail 900 comprises a second side 950 which also extends between the upper end 910 and the opposite lower end 920.

The upper end 910 comprises a hook-like protrusion 911 that extends upwardly and which is adapted to pivotally engage with the earlier-mentioned essentially semi-circular, or hook-like, protrusion 711 of the mounting bracket 700 in a locking manner.

The opposite lower end 920 comprises a protrusion 921 that is substantially perpendicular to said surface 930. This protrusion 921 comprises at least one opening 922, which is adapted to receive at least one fastener 722 for securely locking the mounting rail 900 to the mounting bracket 700.

In an advantageous embodiment, the at least one fastener 722 comprises at least one threaded bolt-and-nut arrangement 722' which can be provided at said at least one opening 922.

In some embodiments (not shown), the at least one opening 922 comprises at least one hole adapted to receive the at least one threaded bolt-and-nut arrangement 722'. In other embodiments, such as the embodiment shown in FIGS. 35A-35B, the at least one opening 922 comprises at least one notch adapted to receive the at least one threaded bolt-and-nut arrangement 722'. Providing one or more notches may facilitate and expedite the mounting of the mounting bracket 700 to the mounting rail 900 at the telecom site when using, or otherwise utilizing, a threaded bolt-and-nut arrangement 722' for securely locking the mounting bracket 700 (e.g., including the telecommunication equipment 110) to the mounting rail 900.

The mounting rail 900 may preferably, though not necessarily, be made of a lightweight material. For example, the mounting rail 900 may be made of aluminum. Other materials are also conceivable. For example, the mounting rail 900 may be made of another metal. Alternatively, the mounting rail 900 may be made of plastic.

Figure 36C:
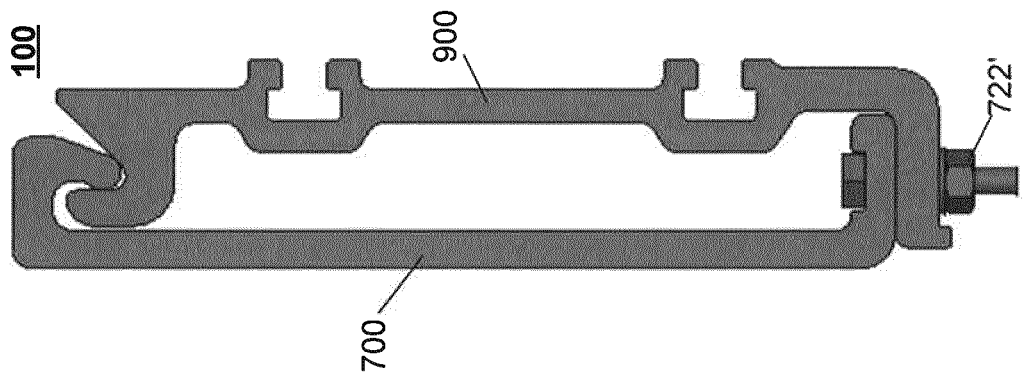
FIG. 36 schematically illustrates side views of the mounting bracket and the mounting rail of FIGS. 34 and 35, respectively.
Figure 36B:
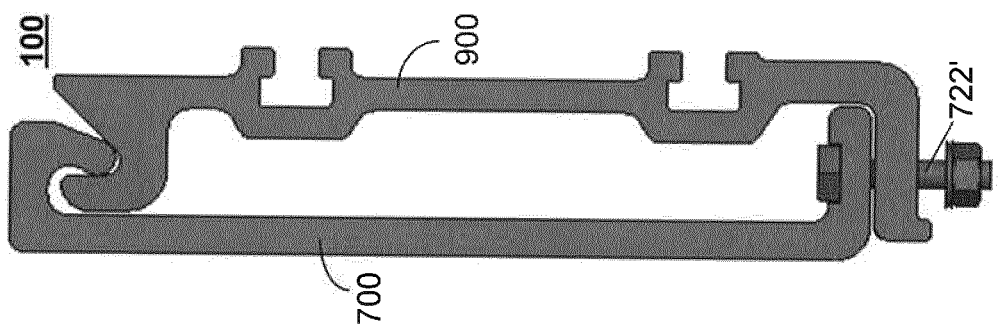
Figure 36A:
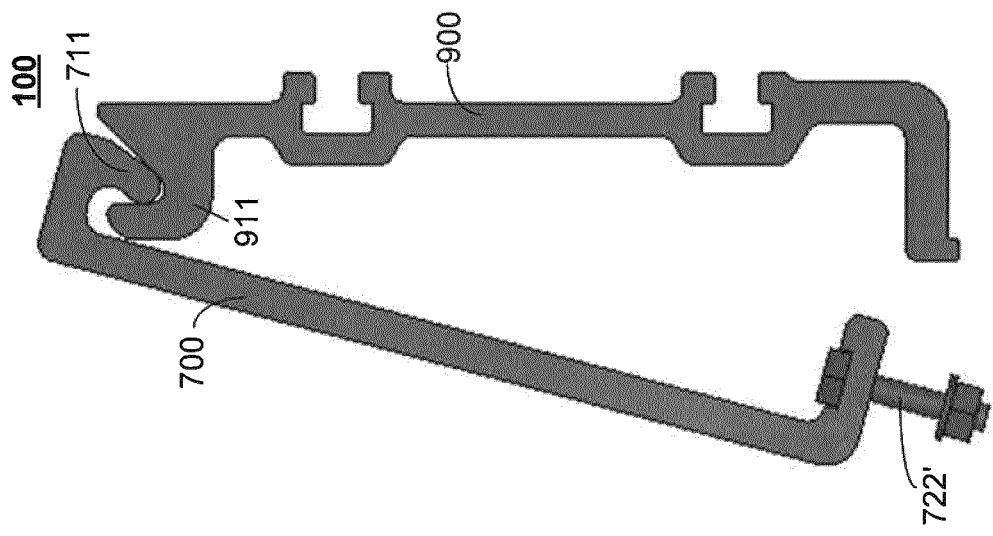
Figure 37A:
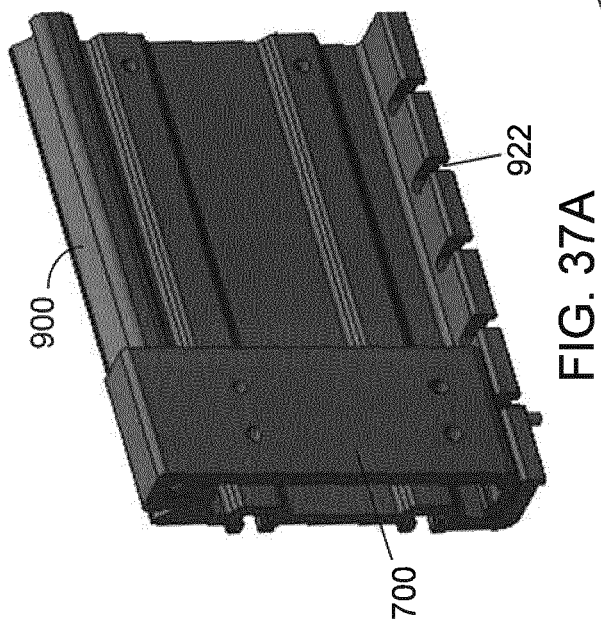
FIG. 37 schematically illustrates that the mounting bracket of FIG. 34 can be positioned at different positions, or locations, along the mounting rail of FIG. 35.
Figure 37B:
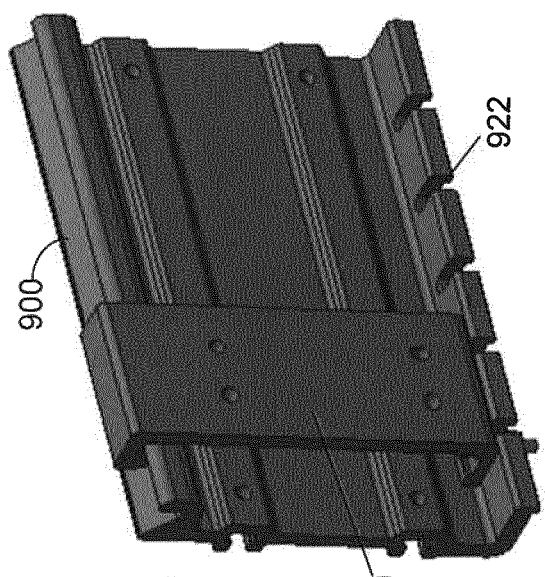
Figure 37C:
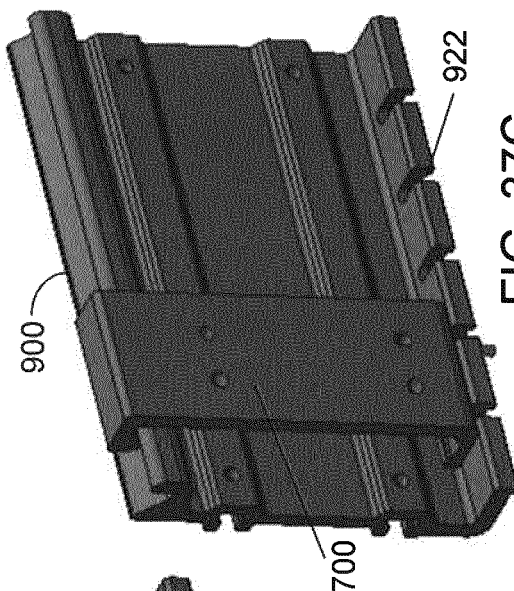
Figure 37E:
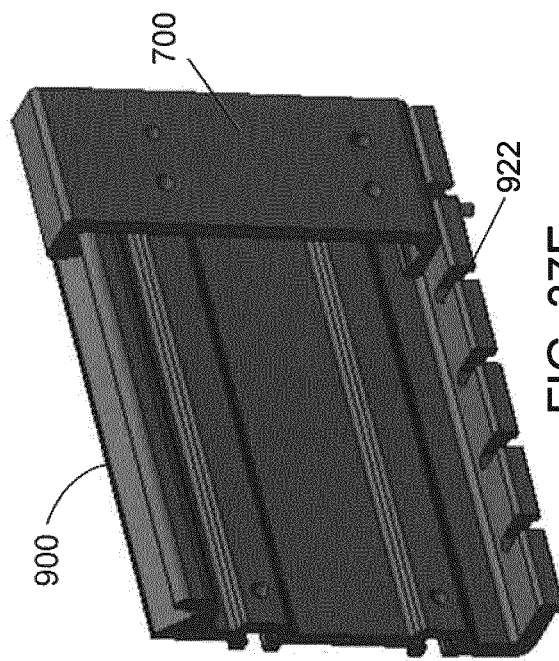
Figure 37D:
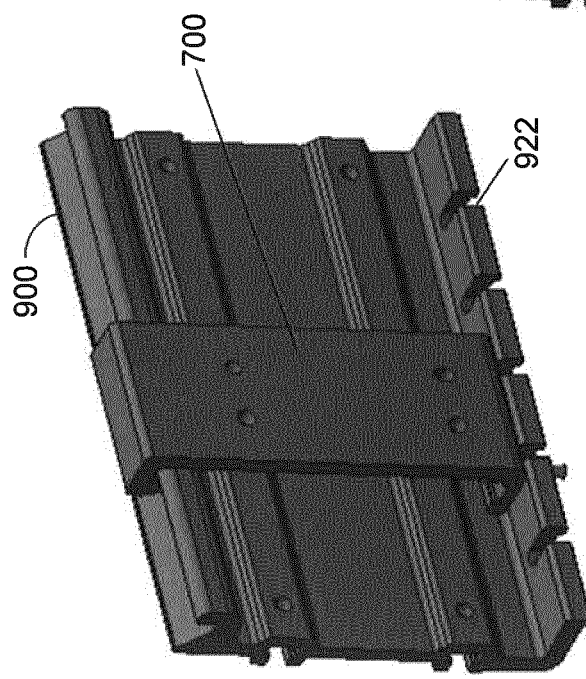

As can be seen in FIG. 36, a mounting system 100 can be formed when the mounting bracket 700 is removably attached, or mounted, to the mounting rail 900. As described earlier, it is possible to removably attach telecommunication equipment 110 such as a RRU to the mounting bracket 700 (see e.g. FIG. 33). It is also possible to removably attach the mounting rail 900 to the structure 120 where the telecommunication equipment 110 is intended to be installed. After a lifting movement of the mounting bracket 700 (for example, including telecommunication equipment 110), it is possible to hook the mounting bracket 700 into the rail (defined by the hook-like protrusion 911) of the mounting rail 900. Once hooked into the rail, it is possible to move the mounting racket 700 towards the mounting rail 900. Once in the position shown in FIGS. 36B and 360, the mounting bracket 700 and the mounting rail 900 can be securely locked to each other, e.g. by means of a threaded bolt-and-nut arrangement 722'.

FIG. 37 illustrates that it may be advantageous to provide several notches 922 at the protrusion 921 of the mounting rail 900. By providing several notches 922 at the protrusion 921 of the mounting rail 900 it is made possible to facilitate for the user, or operator, to flexibly select where the mounting bracket 700 shall be positioned along the mounting rail 900. This may be particularly useful when telecommunication equipment 110 are to be installed along one single mounting rail 900.

In the example embodiment described with reference to FIGS. 33-37, it has been exemplified that the mounting bracket 700 comprises a protrusion 721, which is provided with at least one fastener 722 (e.g. a threaded bolt- and nut arrangement 722') which is adapted to join a corresponding end of the mounting rail 900 such that the mounting rail 900 is securely lockable to the mounting bracket 700. It will be appreciated by those skilled in the relevant art that, in alternative embodiments, the at least one fastener (e.g. a threaded bolt- and nut arrangement) could equally possibly be provided at the protrusion 921 of the mounting rail 900.

The various embodiments that have been described herein may provide several advantages, such as:

Inexpensive solution for mounting telecommunication equipment to a structure.

Flexible solution for mounting telecommunication equipment to a structure.

The length of the mounting brackets and mounting rails may be chosen depending on need. Thus, the length the mounting brackets and mounting rails may be customized.

The mounting system may allow for the mounting of several telecommunication equipment, e.g. RRUs. Thus, the mounting system may fulfill the demands of installing increasingly many RRUs at each telecommunication site.

The mounting of the telecommunication equipment to the structure may be made relatively quickly.

The mounting system may allow for a flexible distribution solution. For example, the mounting rails may be shipped to the telecommunication site where the telecommunication equipment is to be installed at one point in time. The telecommunication equipment may be attached to the mounting bracket at the telecommunication site at the installation. Alternatively, it may be may be attached to the mounting bracket at a different site before being shipped to the telecommunication site for subsequent installation.

Numbered Example Embodiments (NEE)

The technology described in this disclosure thus encompasses without limitation the following example embodiments:

NEE1. A mounting bracket (200; 500) for mounting telecommunication equipment (110) to a structure (120), the mounting bracket (200; 500) comprising an upper end (210; 510) and an opposite lower end (220; 520), wherein a surface (230; 530) between the upper end (210; 510) and the opposite lower end (220; 520) is adapted to abut the telecommunication equipment (110), and the mounting bracket (200; 500) further comprising a first side (240; 540) which extends between the upper end (210; 510) and the opposite lower end (220; 520) and a second side (250; 550) which extends between the upper end (210; 510) and the lower second end (220; 520), wherein the upper end (210; 510) has an essentially semi-circular protrusion (211; 511) extending in a direction away from the surface (230; 530) adapted to abut the telecommunication equipment (110) and which is adapted to pivotally engage with a corresponding hook-like protrusion (311; 611) of a mounting rail (300; 600) in a locking manner; and wherein the lower opposite end (220; 520) comprises a protrusion (221; 521) that is substantially perpendicular to said surface (230; 530) and extends in a direction away from the surface (230; 530) adapted to abut the telecommunication equipment (110), wherein the protrusion (221; 521) comprises at least one fastener (222; 522) which is adapted to engage with a corresponding end of the mounting rail (300; 600) such that the mounting rail (300; 600) is lockable to the mounting bracket (200; 500) by means of the protrusion (221; 521) and the essentially semi-circular protrusion (211; 511).

NEE2. The mounting bracket (200) according to NEE1, wherein the surface (230) adapted to abut the telecommunication equipment (110) comprises a recess (231) that extends in a longitudinal direction from the first side (240)

to the second side (250) and wherein the recess (231) is adapted to receive a protrusion (331) of the mounting rail (300) in a male-female connection manner.

NEE3. The mounting bracket (200) according to NEE2, wherein said recess (231) comprises a damper (232) that extends along the recess (231).

NEE4. The mounting bracket (200) according to NEE3, wherein the dampener (232) is an elastomeric damper.

NEE5. The mounting bracket (200; 500) according to any one of NEE1-NEE4, wherein the at least one fastener (222; 522) is a screw provided in a bore hole of said protrusion.

NEE6. The mounting bracket (200; 500) according to any one of NEE1-NEE4, wherein the at least one fastener (222; 522) is a pin provided in a bore hole of said protrusion.

NEE7. The mounting bracket (200; 500) according to any one of NEE1-NEE6, wherein the essentially semi-circular protrusion (211; 511) comprises several recesses that collectively form a saw tooth pattern.

NEE8. The mounting bracket (200; 500) according to any one of NEE1-NEE7, wherein the mounting bracket (200; 500) is made of aluminum.

NEE9. A mounting rail (300; 600) for mounting telecommunication equipment (110) to a structure (120), wherein the mounting rail (300; 600) is removably attachable to a mounting bracket (200; 500) according to any one of NEE1-NEE7 in a locking manner, the mounting rail (300; 600) comprising an upper end (310; 610) and an opposite lower end (320; 620) and wherein a surface (330; 630) between the upper end (310; 610) and the opposite lower end (320; 620) is removably attachable to said structure (120) where the telecommunication equipment (110) is intended to be mounted, and the mounting rail (300; 600) further comprising a first side (340; 640) which extends between the upper end (310; 610) and the opposite lower end (320; 620) and a second side (350; 650) which extends between the upper end (310; 610) and the opposite lower end (320; 620), wherein
the upper end (310; 610) comprises a hook-like protrusion (311; 611) that extends upwardly and which is adapted to pivotally engage with an essentially semi-circular protrusion (211; 511) of the mounting bracket (200; 500) in a locking manner; and wherein
the opposite lower end (320; 620) comprises a protrusion (321; 621) that is substantially perpendicular to said surface (330; 630), wherein the protrusion (321; 621) comprises at least one recess (322; 622) on its lower side (323; 623) which is adapted to receive at least one fastener (222; 522) of the mounting bracket (200; 500) such that the mounting rail (300; 600) can be attached to the mounting bracket (200; 500) in a locking manner by means of the protrusion (321; 621) and the hook-like protrusion (311; 611).

NEE10. The mounting rail (300) according to NEE9, wherein the surface (330) comprises a protrusion (331) that extends in a longitudinal direction from the first side (340) to the second side (350), wherein the protrusion (331) is adapted to engage with a recess (231) of the mounting bracket (200) in a male-female connection manner.

NEE11. The mounting rail (600) according to NEE9, wherein the surface (630) comprises a protrusion (631) that extends in a longitudinal direction from the first side (640) to the second side (650), wherein the protrusion (631) has an L-shape (632) such that an outer portion (633) of the protrusion (631) extends upwardly towards the upper end (610).

NEE12. The mounting rail (300; 600) according to NEE9, NEE10, or NEE11, wherein the hook-like protrusion (311; 611) comprises several recesses (312) that collectively form a saw tooth pattern.

NEE13. The mounting rail (300; 600) according to any one of NEE9-NEE12, wherein the mounting rail (300; 600) is made of aluminum.

NEE14. A mounting system (100) for mounting telecommunication equipment (110) to a structure (120), wherein the mounting system (100) comprises:
a mounting bracket (200; 500) according to any one of NEE1-NEE8, and
a mounting rail (300; 600) according to any one of NEE9-NEE13.

Modifications and other variants of the described embodiments will come to mind to one skilled in the art having benefit of the teachings presented in the foregoing description and associated drawings. Therefore, it is to be understood that the embodiments are not limited to the specific example embodiments described in this disclosure and that modifications and other variants are intended to be included within the scope of the appended claims. Furthermore, although specific terms may be employed herein, they are used in a generic and descriptive sense only and not for purposes of limitation. Therefore, a person skilled in the art would recognize numerous variations to the described embodiments that would still fall within the scope of the appended claims. As used herein, the terms "comprise/comprises" or "include/includes" do not exclude the presence of other elements or steps. Furthermore, although individual features may be included in different claims (or, embodiments), these may possibly advantageously be combined, and the inclusion of different claims (or, embodiments) does not imply that a certain combination of features is not feasible and/or advantageous. In addition, singular references do not exclude a plurality.

The invention claimed is:

1. A mounting bracket for mounting telecommunication equipment to a structure, the mounting bracket comprising:
an upper end and an opposite lower end, wherein a surface between the upper end and the opposite lower end is adapted to abut the telecommunication equipment;
a first side which extends between the upper end and the opposite lower end; and
a second side which extends between the upper end and the opposite lower end;
wherein the upper end has an essentially semi-circular protrusion extending in a direction away from the surface adapted to abut the telecommunication equipment, and wherein the essentially semi-circular protrusion is adapted to pivotally engage with a corresponding hook-shaped protrusion of a mounting rail in a locking manner; and
wherein the opposite lower end comprises a bracket protrusion that is substantially perpendicular to said surface and extends in a direction away from the surface adapted to abut the telecommunication equipment, wherein the bracket protrusion comprises at least one fastener which is adapted to engage with a corresponding end of the mounting rail such that the mounting rail is lockable to the mounting bracket by the bracket protrusion and the essentially semi-circular protrusion, wherein the surface adapted to abut the telecommunication equipment comprises a recess that extends in a longitudinal direction from the first side to the second side, wherein the recess of the surface is adapted to receive a rail protrusion of the mounting rail in a male-female connection manner, and wherein the recess of the surface comprises a damper that extends along the recess of the surface.

2. The mounting bracket according to claim 1, wherein the damper is an elastomeric damper.

3. The mounting bracket according to claim 1, wherein the at least one fastener is a screw which is provided in a bore hole of said bracket protrusion.

4. The mounting bracket according to claim 1, wherein the at least one fastener is a pin which is provided in a bore hole of said bracket protrusion.

5. The mounting bracket according to claim 1, wherein the essentially semi-circular protrusion comprises several recesses that collectively form a saw tooth pattern.

6. The mounting bracket according to claim 1, wherein the mounting bracket is made of aluminum.

7. A mounting rail for mounting telecommunication equipment to a structure, wherein the mounting rail is removably attachable to a mounting bracket in a locking manner, the mounting rail comprising:
- an upper end and an opposite lower end, wherein a surface between the upper end and the opposite lower end is removably attachable to said structure where the telecommunication equipment is intended to be mounted;
- a first side which extends between the upper end and the opposite lower end; and
- a second side which extends between the upper end and the opposite lower end;
- wherein the upper end comprises a hook-shaped protrusion that extends upwardly, and wherein the hook-shaped protrusion is adapted to pivotally engage with an essentially semi-circular protrusion of the mounting bracket in a locking manner;
- wherein the opposite lower end comprises a rail protrusion that is substantially perpendicular to said surface, and wherein the rail protrusion of the opposite lower end comprises at least one recess on a lower side of the rail protrusion of the opposite lower end, the at least one recess adapted to receive at least one fastener of the mounting bracket such that the mounting rail is attached to the mounting bracket in a locking manner by the rail protrusion of the opposite lower end and the hook-shaped protrusion; and
- wherein the surface between the upper end and the opposite lower end comprises a rail protrusion that extends in a longitudinal direction from the first side to the second side, wherein the rail protrusion of the surface is adapted to engage with a recess of the mounting bracket in a male-female connection manner, and wherein the recess of the mounting bracket comprises a damper that extends along the recess of the mounting bracket.

8. The mounting rail according to claim 7, wherein the rail protrusion of the surface has an L-shape such that an outer portion of the rail protrusion of the surface extends upwardly towards the upper end.

9. The mounting rail according to claim 7, wherein the hook-shaped protrusion comprises several recesses that collectively form a saw tooth pattern.

10. The mounting rail according to claim 7, wherein the mounting rail is made of aluminum.

11. A mounting system for mounting telecommunication equipment to a structure, wherein the mounting system comprises:
a mounting bracket, comprising:
- an upper end and an opposite lower end, wherein a surface between the upper end and the opposite lower end is adapted to abut the telecommunication equipment;
- a first side which extends between the upper end and the opposite lower end; and
- a second side which extends between the upper end and the opposite lower end;
- wherein the upper end has an essentially semi-circular protrusion extending in a direction away from the surface adapted to abut the telecommunication equipment, and wherein the essentially semi-circular protrusion is adapted to pivotally engage with a corresponding hook-shaped protrusion of a mounting rail in a locking manner; and
- wherein the opposite lower end comprises a bracket protrusion that is substantially perpendicular to said surface and extends in a direction away from the surface adapted to abut the telecommunication equipment, wherein the bracket protrusion comprises at least one fastener which is adapted to engage with a corresponding end of the mounting rail such that the mounting rail is lockable to the mounting bracket by the bracket protrusion and the essentially semi-circular protrusion, wherein the surface adapted to abut the telecommunication equipment comprises a recess that extends in a longitudinal direction from the first side to the second side, wherein the recess of the surface is adapted to receive a rail protrusion of the mounting rail in a male-female connection manner, and wherein the recess of the surface comprises a damper that extends along the recess of the surface; and
the mounting rail being removably attachable to the mounting bracket in a locking manner, the mounting rail comprising:
- an upper end and an opposite lower end, wherein a surface, between the upper end and the opposite lower end of the mounting rail, is removably attachable to said structure, where the telecommunication equipment is intended to be mounted;
- a first side which extends between the upper end and the opposite lower end of the mounting rail; and
- a second side which extends between the upper end and the opposite lower end of the mounting rail;
- wherein the upper end of the mounting rail comprises the corresponding hook-shaped protrusion that extends upwardly, and wherein the corresponding hook-shaped protrusion is adapted to pivotally engage with the essentially semi-circular protrusion of the mounting bracket in the locking manner;
- wherein the opposite lower end of the mounting rail comprises a rail protrusion that is substantially perpendicular to said surface of the mounting rail, and wherein the rail protrusion of the opposite lower end of the mounting rail comprises at least one recess on a lower side of the rail protrusion of the opposite lower end of the mounting rail, the at least one recess adapted to receive the at least one fastener of the mounting bracket such that the mounting rail is attached to the mounting bracket in a locking manner by the rail protrusion of the opposite lower end of the mounting rail and the corresponding hook-shaped protrusion; and
- wherein the surface between the upper end and the opposite lower end of the mounting rail comprises the rail protrusion that extends in a longitudinal direction from the first side of the mounting rail to the second side of the mounting rail, and wherein the rail protrusion of the surface of the mounting rail is adapted to engage with the recess of the mounting bracket in the male-female connection manner.

12. A mounting bracket for mounting telecommunication equipment to a structure, the mounting bracket comprising:
an upper end and an opposite lower end, wherein a surface between the upper end and the opposite lower end is adapted to abut the telecommunication equipment;
a first side which extends between the upper end and the opposite lower end; and
a second side which extends between the upper end and the opposite lower end;
wherein the upper end has an essentially semi-circular protrusion extending in a direction away from the surface adapted to abut the telecommunication equipment, wherein the essentially semi-circular protrusion is adapted to pivotally engage with a corresponding hook-shaped protrusion of a mounting rail in a locking manner, and wherein the corresponding hook-shaped protrusion comprises several recesses that collectively form a saw tooth pattern; and
wherein the opposite lower end comprises a bracket protrusion that is substantially perpendicular to said surface and extends in a direction away from the surface adapted to abut the telecommunication equipment, wherein the bracket protrusion is provided with at least one fastener which is adapted to join a corresponding end of the mounting rail, the corresponding end of the mounting rail comprising a plurality of notches such that the mounting rail is securely lockable to the mounting bracket, and wherein the bracket protrusion is adapted to abut the mounting rail above a lower end of the mounting rail on a surface between the lower end of the mounting bracket and an opposite upper end of the mounting rail.

13. The mounting bracket according to claim 12, wherein the at least one fastener comprises at least one threaded bolt-and-nut arrangement.

14. The mounting bracket according to claim 13, wherein said bracket protrusion comprises a hole for receiving the at least one threaded bolt-and-nut arrangement such that the at least one threaded bolt-and-nut arrangement is provided in said hole.

15. The mounting bracket according to claim 14, wherein said hole is a hole which extends along the bracket protrusion in a direction from the first side to the second side.

16. The mounting bracket according to claim 12, wherein the mounting bracket is made of aluminum.

17. A mounting rail for mounting telecommunication equipment to a structure, wherein the mounting rail is removably attachable to a mounting bracket in a locking manner, the mounting rail comprising:
an upper end and an opposite lower end, wherein a surface between the upper end and the opposite lower end is removably attachable to said structure, where the telecommunication equipment is intended to be mounted;
a first side which extends between the upper end and the opposite lower end; and
a second side which extends between the upper end and the opposite lower end,
wherein the upper end comprises a hook-shaped protrusion that extends upwardly, wherein the hook-shaped protrusion is adapted to pivotally engage with an essentially semi-circular protrusion of the mounting bracket in a locking manner, and wherein the hook-shaped protrusion comprises several recesses that collectively form a saw tooth pattern; and
wherein the opposite lower end comprises a rail protrusion that is substantially perpendicular to said surface, and wherein the rail protrusion comprises at least one opening, the at least one opening comprising a plurality of notches which is adapted to receive at least one fastener for securely locking the mounting rail to the mounting bracket.

18. The mounting rail according to claim 17, wherein the at least one fastener comprises at least one threaded bolt-and-nut arrangement.

19. The mounting rail according to claim 18, wherein at least one notch of the plurality of notches receives the at least one threaded bolt-and-nut arrangement.

20. The mounting rail according to claim 17, wherein the mounting rail is made of aluminum.

21. A mounting system for mounting telecommunication equipment to a structure, wherein the mounting system comprises:
a mounting bracket, comprising:
an upper end and an opposite lower end, wherein a surface between the upper end and the opposite lower end is adapted to abut the telecommunication equipment;
a first side which extends between the upper end and the opposite lower end; and
a second side which extends between the upper end and the opposite lower end;
wherein the upper end has an essentially semi-circular protrusion extending in a direction away from the surface adapted to abut the telecommunication equipment, wherein the essentially semi-circular protrusion is adapted to pivotally engage with a corresponding hook-shaped protrusion of a mounting rail in a locking manner, and wherein the corresponding hook-shaped protrusion comprises several recesses that collectively form a saw tooth pattern; and
wherein the opposite lower end comprises a bracket protrusion that is substantially perpendicular to said surface and extends in a direction away from the surface adapted to abut the telecommunication equipment, wherein the bracket protrusion is provided with at least one fastener which is adapted to join a corresponding end of the mounting rail such that the mounting rail is securely lockable to the mounting bracket, and wherein the bracket protrusion is adapted to abut the mounting rail above a lower end of the mounting rail on a surface between the lower end of the mounting bracket and an opposite upper end of the mounting rail; and
the mounting rail being removably attachable to the mounting bracket in a locking manner, the mounting rail comprising:
an upper end and an opposite lower end, wherein a surface, between the upper end and the opposite lower end of the mounting rail, is removably attachable to said structure, where the telecommunication equipment is intended to be mounted;
a first side which extends between the upper end and the opposite lower end of the mounting rail; and
a second side which extends between the upper end and the opposite lower end of the mounting rail;
wherein the upper end of the mounting rail comprises the corresponding hook-shaped protrusion that extends upwardly, and wherein the corresponding hook-shaped protrusion is adapted to pivotally engage with the essentially semi-circular protrusion of the mounting bracket in the locking manner; and wherein the opposite lower end of the mounting rail comprises a rail protrusion that is substantially perpendicular to said surface of the mounting rail, and wherein the rail protrusion comprises at least one opening, the at least one opening comprising a plurality of notches adapted to receive the at least one fastener of the mounting bracket for securely locking the mounting rail to the mounting bracket.

\* \* \* \* \*